United States Patent
Katsumata et al.

(10) Patent No.: US 8,189,371 B2
(45) Date of Patent: May 29, 2012

(54) NONVOLATILE SEMICONDUCTOR MEMORY DEVICE AND METHOD FOR DRIVING SAME

(75) Inventors: Ryota Katsumata, Mie-ken (JP); Hideaki Aochi, Kanagawa-ken (JP); Hiroyasu Tanaka, Mie-ken (JP); Masaru Kito, Kanagawa-ken (JP); Yoshiaki Fukuzumi, Kanagawa-ken (JP); Masaru Kidoh, Tokyo (JP); Yosuke Komori, Mie-ken (JP); Megumi Ishiduki, Mie-ken (JP); Junya Matsunami, Kanagawa-ken (JP); Tomoko Fujiwara, Kanagawa-ken (JP); Ryouhei Kirisawa, Kanagawa-ken (JP); Yoshimasa Mikajiri, Mie-ken (JP); Shigeto Oota, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 12/851,002

(22) Filed: Aug. 5, 2010

(65) Prior Publication Data
US 2011/0103149 A1 May 5, 2011

(30) Foreign Application Priority Data

Nov. 2, 2009 (JP) ................................. 2009-251892

(51) Int. Cl.
*G11C 11/14* (2006.01)
(52) U.S. Cl. ..................... 365/161; 365/87; 365/185.23; 365/230.06; 365/185.25
(58) Field of Classification Search .................. 365/161, 365/87, 185.23, 123.06, 185.25
See application file for complete search history.

(56) References Cited

U.S. PATENT DOCUMENTS

| 2007/0097738 A1* | 5/2007 | Asano et al. .................. 365/163 |
| 2007/0252201 A1 | 11/2007 | Kito et al. |
| 2010/0096682 A1 | 4/2010 | Fukuzumi et al. |
| 2010/0109072 A1 | 5/2010 | Kidoh et al. |
| 2010/0117137 A1 | 5/2010 | Fukuzumi et al. |

FOREIGN PATENT DOCUMENTS

| JP | 2007-266143 | 10/2007 |
| WO | WO 2009/075370 A1 | 6/2009 |
| WO | WO 2010/035609 A1 | 4/2010 |

OTHER PUBLICATIONS

U.S. Appl. No. 12/679,991, filed Mar. 25, 2010, Yoshiaki Fukuzumi et al.

* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array and a control circuit. The memory cell array includes a stacked body, a through-hole, a semiconductor pillar, and a charge storage film. The stacked body includes a plurality of insulating films alternately stacked with a plurality of electrode films. The through-hole is made in the stacked body to align in a stacking direction. The semiconductor pillar is buried in the through-hole. The charge storage film is provided between the electrode films and the semiconductor pillar. Memory cells are formed at each intersection between the electrode films and the semiconductor pillar. The control circuit writs a first value to at least some of the memory cells, performs an erasing operation of the first value from the memory cell written with the first value, reads data stored in the memory cell having undergone the erasing operation, and sets the memory cell to be unusable in a case that the first value is read from the memory cell.

18 Claims, 17 Drawing Sheets

| | WRITING OPERATION | | READING OPERATION | | ERASING OPERATION |
|---|---|---|---|---|---|
| | SELECTED | UNSELECTED | SELECTED | UNSELECTED | SELECTED BLOCK |
| | VALUE "0": Vss | | | | |
| BIT LINE BL | VALUE "1": Vdd | | $V_{bl}$ | | $V_{erase}$ |
| SELECTION GATE ELECTRODE SGb | $V_{sg}$ | $V_{off}$ | $V_{on}$ | $V_{off}$ | $V_{sg}$ |
| CONTROL GATE ELECTRODE CGb (FOURTH LAYER) | $V_{pass}$ | $V_{pass}$ | $V_{read}$ | $V_{read}$ | $V_{ss}$ |
| CONTROL GATE ELECTRODE CGb (THIRD LAYER) | $V_{pgm}$ | $V_{pgm}$ | $V_{ss}$ | $V_{read}$ | $V_{ss}$ |
| CONTROL GATE ELECTRODE CGb (SECOND LAYER) | $V_{pass}$ | $V_{pass}$ | $V_{read}$ | $V_{read}$ | $V_{ss}$ |
| CONTROL GATE ELECTRODE CGb (FIRST LAYER) | $V_{pass}$ | $V_{pass}$ | $V_{read}$ | $V_{read}$ | $V_{ss}$ |
| BACK GATE BG | $V_{on}$ | | $V_{on}$ | | $V_{on}$ |
| CONTROL GATE ELECTRODE CGs (FIRST LAYER) | $V_{pass}$ | $V_{pass}$ | $V_{read}$ | $V_{read}$ | $V_{ss}$ |
| CONTROL GATE ELECTRODE CGs (SECOND LAYER) | $V_{pass}$ | $V_{pass}$ | $V_{read}$ | $V_{read}$ | $V_{ss}$ |
| CONTROL GATE ELECTRODE CGs (THIRD LAYER) | $V_{pass}$ | $V_{pass}$ | $V_{read}$ | $V_{read}$ | $V_{ss}$ |
| CONTROL GATE ELECTRODE CGs (FOURTH LAYER) | $V_{pass}$ | $V_{pass}$ | $V_{read}$ | $V_{read}$ | $V_{ss}$ |
| SELECTION GATE ELECTRODE SGs | $V_{off}$ | $V_{off}$ | $V_{on}$ | $V_{off}$ | $V_{sg}$ |
| SOURCE LINE SL | $V_{dd}$ | $V_{dd}$ | $V_{ss}$ | $V_{ss}$ | $V_{erase}$ |

NONVOLATILE SEMICONDUCTOR MEMORY DEVICE AND METHOD FOR DRIVING SAME

CROSS-REFERENCE TO RELATED APPLICATIONS

This application is based upon and claims the benefit of priority from the prior Japanese Patent Application No. 2009-251892, filed on Nov. 2, 2009; the entire contents of which are incorporated herein by reference.

FIELD

Embodiments described herein relate generally to a nonvolatile semiconductor memory device and method for driving the same.

BACKGROUND

Semiconductor memory devices of flash memory and the like conventionally have been constructed by two-dimensionally integrating memory cells on the surface of a silicon substrate. In such a semiconductor memory device, it is necessary to increase the integration of the memory cells to reduce the cost per bit and increase the storage capacity. However, such increases of integration in recent years have become difficult in regard to both cost and technology.

Methods of three-dimensional integration by stacking memory cells have been proposed as technology to breakthrough the limitations of increasing the integration. However, methods that simply stack and pattern one layer after another undesirably increase the number of processes as the number of stacks increases, and the costs undesirably increase. In particular, the increase of lithography processes for patterning the transistor structure is a main cause of increasing costs. Therefore, the reduction of the chip surface area per bit by stacking has not led to lower costs per bit as much as downsizing within the chip plane and is problematic as a method for increasing the storage capacity.

In consideration of such problems, the inventors have proposed a collectively patterned three-dimensionally stacked memory (for instance, refer to JP-A 2007-266143 (Kokai)). In such technology, a stacked body including electrode films alternately stacked with insulating films is formed on a silicon substrate; and subsequently, through-holes are made in the stacked body by collective patterning. A blocking film, a charge storage film, and a tunneling film are deposited in this order to form a memory film on the side face of the through-hole; and a silicon pillar is buried in the interior of the through-hole. A memory transistor is thereby formed at an intersection between each electrode film and the silicon pillar.

In such a collectively patterned three-dimensionally stacked memory, a charge can be removed from and put into the charge storage layer from the silicon pillar to store information by controlling an electrical potential of each electrode film and each silicon pillar. According to such technology, the through-holes are made by collectively patterning the stacked body. Therefore, the number of lithography processes does not increase and cost increases can be suppressed even in the case where the number of stacks of the electrode films increases.

BRIEF DESCRIPTION OF THE DRAWINGS

FIG. 7 is a table of potentials applied to each electrode and interconnection during the operations of the nonvolatile semiconductor memory device according to the first embodiment;

DETAILED DESCRIPTION

In general, according to one embodiment, a nonvolatile semiconductor memory device includes a memory cell array and a control circuit. The memory cell array includes a stacked body, a through-hole, a semiconductor pillar, and a charge storage film. The stacked body includes a plurality of insulating films alternately stacked with a plurality of electrode films. The through-hole is made in the stacked body to align in a stacking direction. The semiconductor pillar is buried in the through-hole. The charge storage film is provided between the electrode films and the semiconductor pillar. Memory cells are formed at each intersection between the electrode films and the semiconductor pillar. The control circuit writs a first value to at least some of the memory cells, performs an erasing operation of the first value from the memory cell written with the first value, reads data stored in the memory cell having undergone the erasing operation, and sets the memory cell to be unusable in a case that the first value is read from the memory cell.

Embodiments of the invention will now be described with reference to the drawings.

First, a first embodiment will be described.

Figure 1:
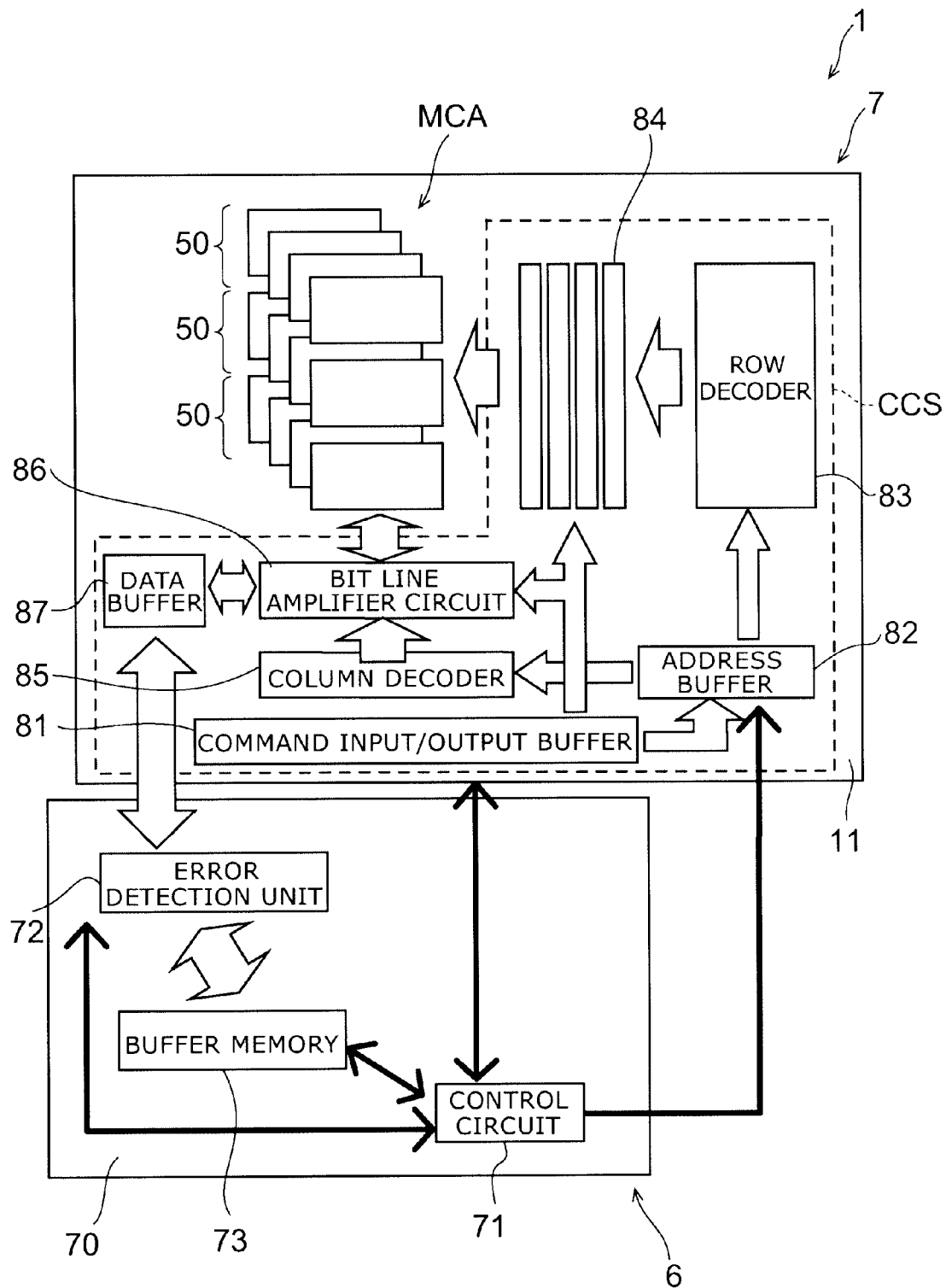
FIG. 1 is a block diagram of a nonvolatile semiconductor memory device according to a first embodiment.

FIG. 1 is a block diagram illustrating a nonvolatile semiconductor memory device according to this embodiment.

Figure 2:
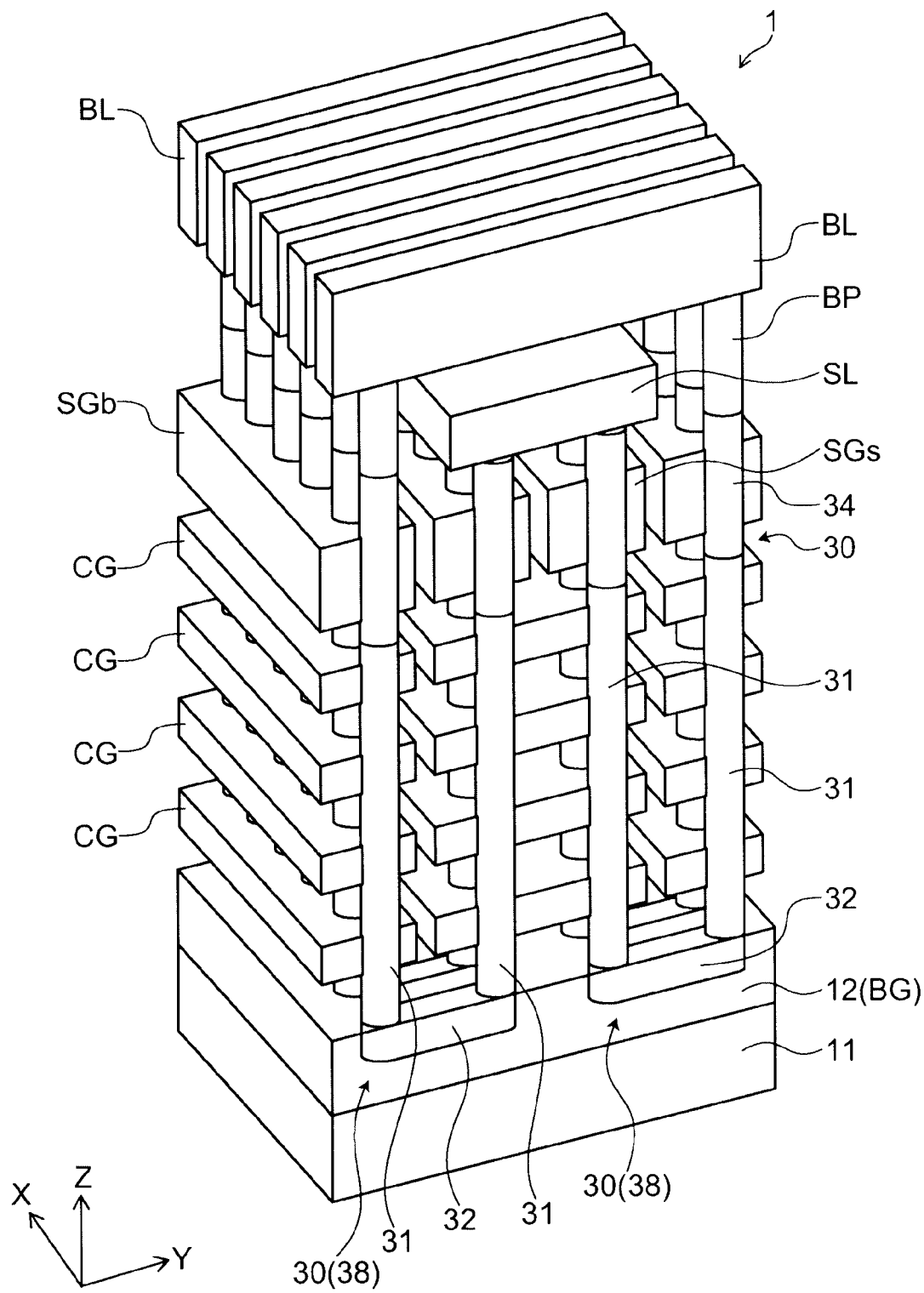
FIG. 2 is a perspective view of the nonvolatile semiconductor memory device according to the first embodiment.

FIG. 2 is a perspective view illustrating the nonvolatile semiconductor memory device according to this embodiment.

Figure 3:
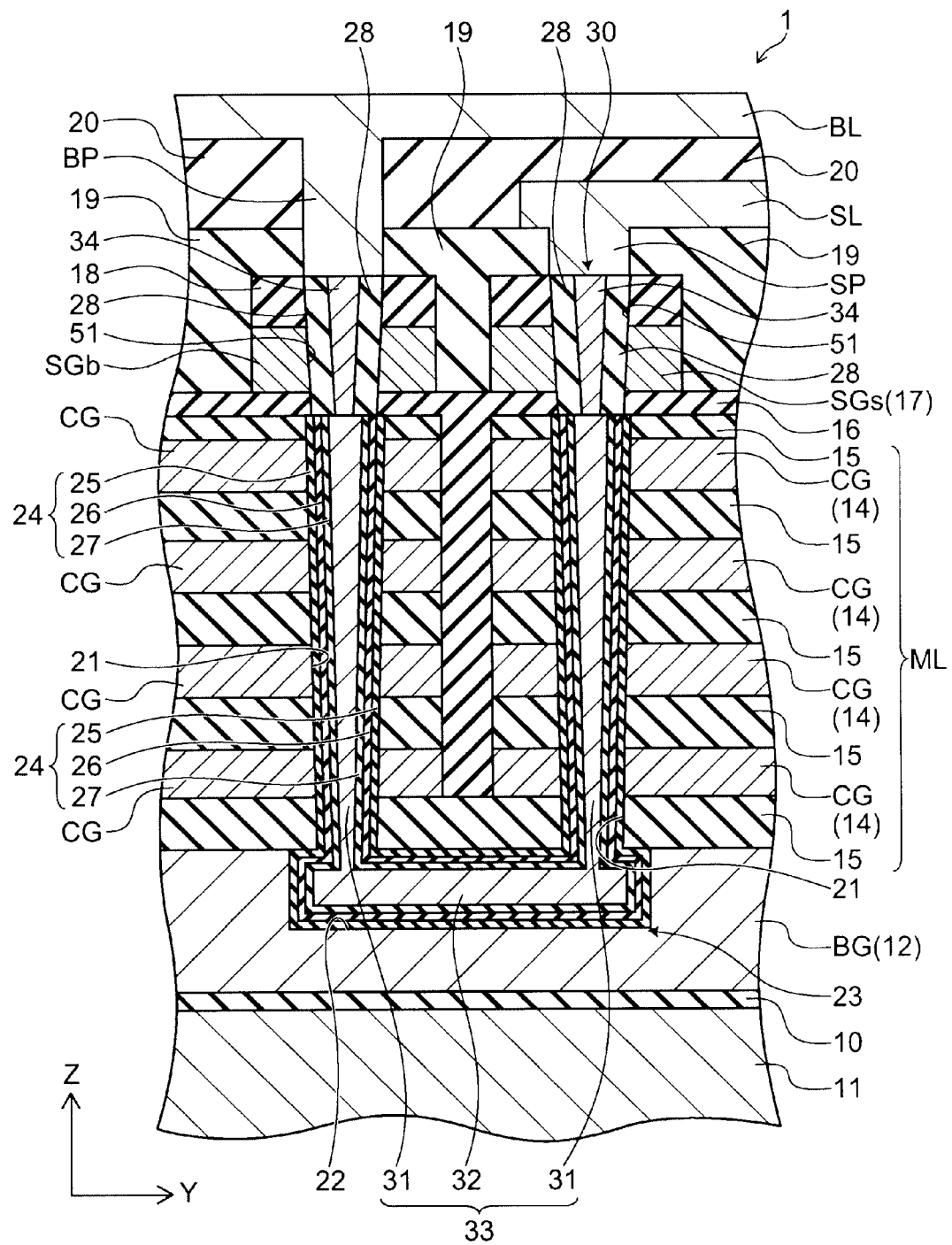
FIG. 3 is a cross-sectional view of the nonvolatile semiconductor memory device according to the first embodiment.

FIG. 3 is a cross-sectional view illustrating the nonvolatile semiconductor memory device according to this embodiment.

Figure 4:
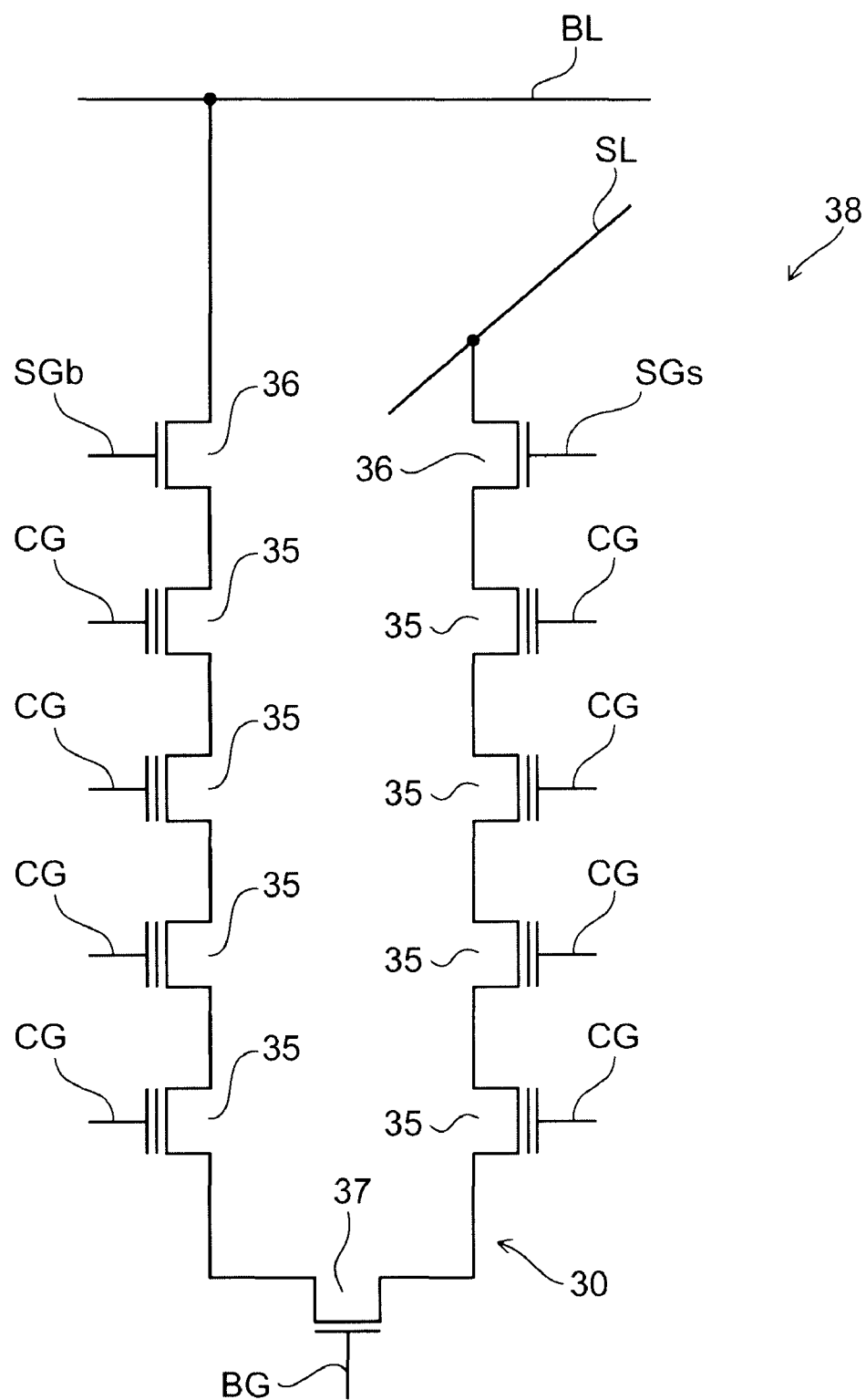
FIG. 4 is a circuit diagram of a memory string of the nonvolatile semiconductor memory device according to the first embodiment.

FIG. 4 is a circuit diagram illustrating a memory string of the nonvolatile semiconductor memory device according to this embodiment.

Figure 5:
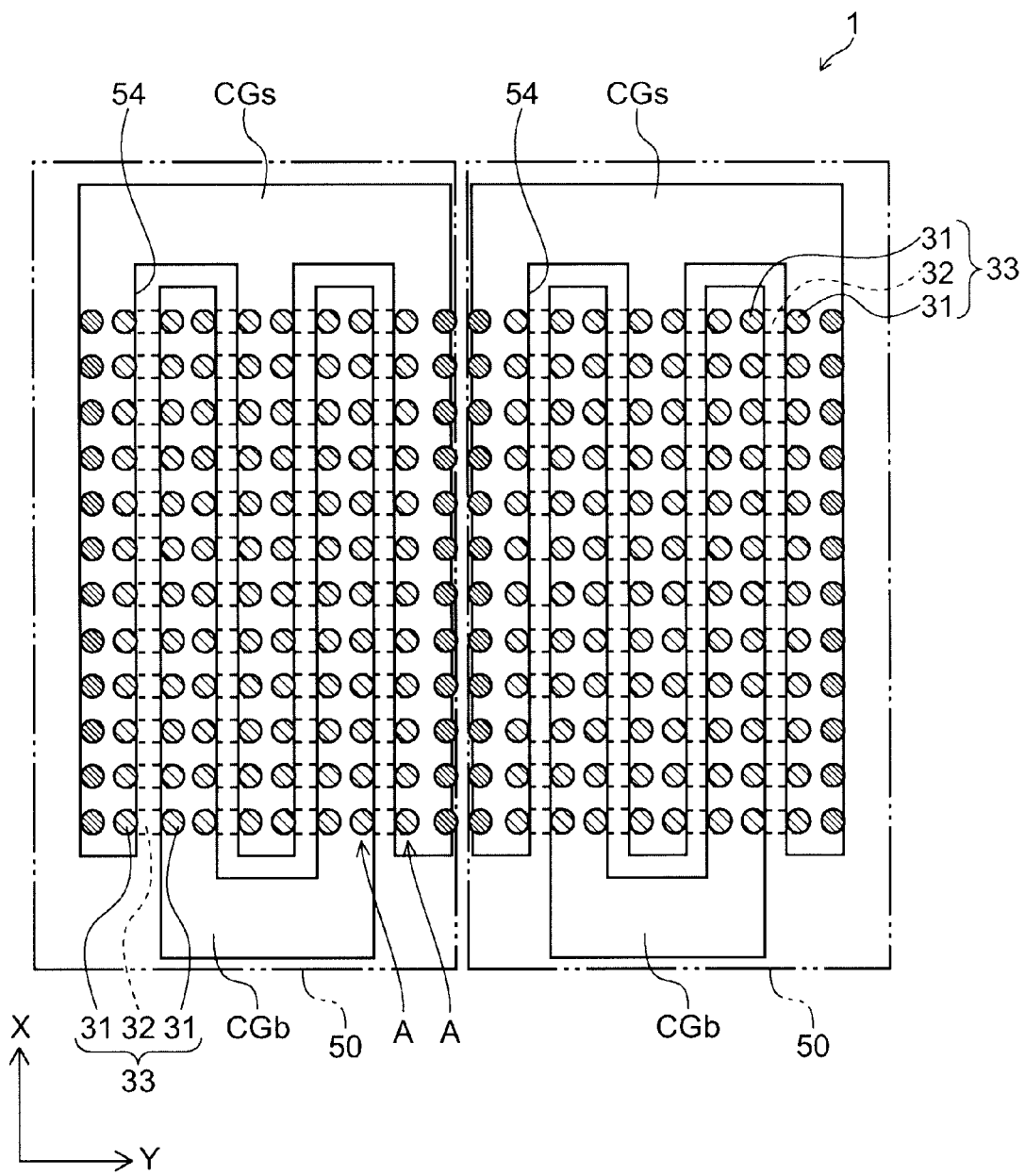
FIG. 5 is a plan view of electrode films of the nonvolatile semiconductor memory device according to the first embodiment.

FIG. 5 is a plan view illustrating electrode films of the nonvolatile semiconductor memory device according to this embodiment.

For easier viewing of the drawings in FIG. 1 and FIG. 2, only the conductive portions are illustrated, and the insulating portions are omitted. This is similar for FIG. 9 described below. For convenience of illustration in FIG. 2, the silicon pillars are illustrated with the same width regardless of the position in the Z direction.

First, distinctive portions of this embodiment will be described summarily.

A feature of the nonvolatile semiconductor memory device according to this embodiment is that in a collectively patterned three-dimensionally stacked memory device in which a memory cell array to store data and a control circuit to control the memory cell array are provided and memory transistors are provided at intersections between silicon pillars and control gate electrodes in the memory cell array, a first value is written to at least some of the memory cells during a formatting; then, it is attempted to erase the first value from the memory cells; subsequently, the values written to the memory cells are read; and the memory cells from which the first value is read are determined to have an error during the erasing operation and are set to be unusable thereafter.

As illustrated in FIG. 1, a nonvolatile semiconductor memory device 1 according to this embodiment (hereinbelow also referred to as "the device 1") includes a controller chip 6 and a memory chip 7. In the controller chip 6, a control circuit 71, an error detection unit 72, and a buffer memory 73 are provided in a silicon substrate 70. On the other hand, in the memory chip 7, a memory cell array MCA and a peripheral circuit unit CCS are provided in a silicon substrate 11. The peripheral circuit unit CCS includes a command input/output buffer 81, an address buffer 82, a row decoder 83, a word line drive circuit 84, a column decoder 85, a bit line amplifier circuit 86, and a data buffer 87.

First, the configuration of the controller chip 6 will be described.

The control circuit 71 of the controller chip 6 includes, for example, an FPGA (field programmable gate array). Alternatively, the control circuit 71 may include a combination of a CPU (central processing unit), RAM (random access memory), and nonvolatile memory (non-volatile memory). Or, the control circuit 71 may include a combination of a CPU and a NOR flash memory. A NOR flash memory is a random access nonvolatile memory.

The control circuit 71 determines to which memory cell of the memory cell array MCA to store data input from outside the device 1. In other words, a correspondence is provided between a logical address included in the input data to a physical address. The control circuit 71 performs an error detection operation to determine whether or not the data read from the memory cell array MCA is correct and performs wafer leveling to make the writing region uniform over the entire memory cell array MCA. The control circuit 71 also outputs commands to the command input/output buffer 81 to instruct the content of processing, that is, to write, read, or erase the data and outputs the physical address to the address buffer 82 to indicate the memory cells to undergo the processing.

In addition to the processing described above, the control circuit 71 writes the value "0" to some of the memory cells of the memory cell array MCA, performs an erasing operation of the value "0" from the memory cells to which the value "0" was written, reads the data stored in these memory cells, and performs a determination operation to record the addresses of the memory cells from which the value "0" was read during a formatting of the device 1. Then, the control circuit 71 sets the memory cells from which the value "0" was read to be unusable in the writing operations and the reading operations thereafter. A program to perform such processing is stored in the control circuit 71, or the control circuit 71 includes a processing sequence.

The error detection unit 72 is a circuit that performs an error detection processing with the control circuit 71 of the data read from the memory chip 7. The buffer memory 73 is a memory that temporarily stores the data to undergo the error detection processing.

The configuration of the memory chip 7 will now be described.

Features of the memory chip 7 include memory cells arranged three-dimensionally in a stacked body ML (referring to FIG. 3) provided in the memory cell array MCA and through-holes 21 piercing the stacked body ML, where the diameters of the through-holes 21 become finer downward. The configuration of the memory cell array MCA will now be described in detail.

As illustrated in FIG. 2 and FIG. 3, an insulating film 10 is provided on the silicon substrate 11 in the memory cell array MCA. Thereupon, a conductive film, e.g., a polysilicon film 12, is formed to form a back gate BG. Multiple electrode films 14 are alternately stacked with multiple insulating films 15 on the back gate BG; and the stacked body ML is formed.

For convenience of description in the specification, an XYZ orthogonal coordinate system will now be introduced. In this coordinate system, two mutually orthogonal directions parallel to an upper face of the silicon substrate 11 are taken as an X direction and a Y direction. A direction orthogonal to both the X direction and the Y direction, that is, the stacking direction of each of the layers, is taken as a Z direction.

The electrode film 14 is formed of, for example, polysilicon. In an X-direction central portion of the stacked body ML, the electrode film 14 is divided along the Y direction to form multiple control gate electrodes CG aligned in the X direction. The electrode film 14 of each of the layers is patterned into the same pattern as viewed from above, i.e., the Z direction. As described below, at both X-direction end portions of the stacked body ML, the electrode film 14 is not divided along the Y direction to form one pair of comb-shaped configurations. On the other hand, the insulating films 15 are made of, for example, silicon oxide ($SiO_2$) and function as inter-layer insulating films to insulate the electrode films 14 from each other.

An insulating film 16, a conductive film 17, and an insulating film 18 are formed in this order on the stacked body ML. The conductive film 17 made of, for example, polysilicon, is divided along the Y direction, and forms multiple selection gate electrodes SG aligned in the X direction. Two selection gate electrodes SG are provided in the region directly above each of the control gate electrodes CG of the uppermost layer. That is, although the selection gate electrode SG is aligned in the same direction (the X direction) as the control gate electrode CG, the arrangement period is half. As described below, the selection gate electrodes SG include a selection gate electrode SGb on the bit line side and a selection gate electrode SGs on the source line side.

An insulating film 19 is provided on the insulating film 18. A source line SL is provided on the insulating film 19 to align in the X direction. The source line SL is disposed in a region directly above every other one of the control gate electrodes CG of the uppermost layer arranged along the Y direction. An insulating film 20 is provided on the insulating film 19 to cover the source line SL. Multiple bit lines BL are provided on the insulating film 20 to align in the Y direction. Each of the source lines SL and the bit lines BL is formed of a metal film.

Multiple through-holes 21 are aligned in the stacking direction (the Z direction) of each of the layers to pierce the stacked body ML. The configuration of the through-hole 21 is, for example, circular as viewed from the Z direction. On the other hand, the side face of the through-hole 21 inclines with respect to the perpendicular direction; and the through-hole 21 becomes finer downward. Each of the through-holes 21 pierces the control gate electrode CG of each of the levels; and the lower end reaches the back gate BG. The through-holes 21 are arranged in a matrix configuration along the X direction and the Y direction. Because the control gate electrode CG is aligned in the X direction, multiple through-holes 21 arranged in the X direction pierce the same control gate electrode CG. The arrangement period of the through-holes 21 in the Y direction is half the arrangement period of the control gate electrodes CG. Thereby, two of the through-holes 21 arranged in the Y direction form one set; and the through-holes 21 belonging to the same set pierce the same control gate electrode CG.

A communicating hole 22 is made in an upper layer portion of the back gate BG so that the lower end portion of one through-hole 21 communicates with the lower end portion of one other through-hole 21 distal one column in the Y direction as viewed from the one through-hole 21. Thereby, one continuous U-shaped hole 23 is made of one pair of the through-holes 21 adjacent to each other in the Y direction and the communicating hole 22 communicating between the pair. Multiple U-shaped holes 23 are made in the stacked body ML.

An ONO (Oxide Nitride Oxide) film 24 is provided on an inner face of the U-shaped hole 23 via a barrier film (not illustrated) made of, for example, silicon nitride. In the ONO film 24, an insulative blocking film 25, a charge storage film 26, and an insulative tunneling film 27 are stacked in order from the outside. The blocking film 25 is a film in which current substantially does not flow even when a voltage in the range of the drive voltage of the device 1 is applied and is formed of, for example, a high dielectric constant material, e.g., silicon oxide, having a dielectric constant higher than the dielectric constant of the material forming the charge storage film 26. The charge storage film 26 is a film capable of trapping charge and is formed of, for example, silicon nitride. Although the tunneling film 27 normally is insulative, the tunneling film 27 is a film in which a tunneling current flows when a prescribed voltage in the range of the drive voltage of the device 1 is applied and is formed of, for example, silicon oxide. The film thickness of the ONO film 24 is substantially uniform over the entire region on the inner face of the U-shaped hole 23.

A semiconductor material doped with an impurity, e.g., polysilicon, is filled into the interior of the U-shaped hole 23. Thereby, a U-shaped silicon member 33 is provided in the interior of the U-shaped hole 23. The portion of the U-shaped silicon member 33 positioned in the through-hole 21 forms a silicon pillar 31; and the portion positioned in the communicating hole 22 forms a connection member 32. The silicon pillar 31 has a columnar configuration, e.g., a circular columnar configuration, aligned in the Z direction. However, as described above, the diameter of the through-hole 21 becomes finer downward. Therefore, the diameter of the silicon pillar 31 filled into the interior thereof also becomes finer downward. The connection member 32 has a columnar configuration, e.g., a quadrilateral columnar configuration, aligned in the Y direction. Two of the silicon pillars 31 and one of the connection members 32 are formed integrally to form the U-shaped silicon member 33. Accordingly, the U-shaped silicon member 33 is formed continuously without breaks along the longitudinal direction thereof. The U-shaped silicon member 33 is insulated from the back gate BG and the control gate electrode CG by the ONO film 24.

Multiple through-holes 51 are made in the insulating film 16, the selection gate electrode SG, and the insulating film 18. Each of the through-holes 51 is made in a region directly above each of the through-holes 21 to communicate with each of the through-holes 21. Here, because the selection gate electrode SG is aligned in the X direction, the through-holes 51 arranged in the X direction pierce the same selection gate electrode SG. The arrangement period of the through-hole 51 in the Y direction is the same as the arrangement period of the selection gate electrode SG with the same arrangement phase. Accordingly, one of the multiple through-holes 51 arranged in the Y direction corresponds to one of the selection gate electrodes SG; and the multiple through-holes 51 pierce mutually different selection gate electrodes SG.

A gate insulating film 28 is formed on the inner face of the through-hole 51. Polysilicon, for example, is filled into the interior of the through-hole 51 to form a silicon pillar 34. The silicon pillar 34 has a columnar configuration, e.g., a circular columnar configuration, aligned in the Z direction. The lower end portion of the silicon pillar 34 is connected to the upper end portion of the silicon pillar 31 formed in a region directly therebelow. The silicon pillar 34 is insulated from the selection gate electrode SG by the gate insulating film 28. A U-shaped pillar 30 is formed of the U-shaped silicon member 33 and the pair of silicon pillars 34 connected to the upper end portions thereof.

The positional relationship among the U-shaped pillar 30, the control gate electrode CG, the selection gate electrode SG, the source line SL, and the bit line BL will now be described. As described above, one pair of the silicon pillars 34 and 31 mutually adjacent in the Y direction is connected to each other by the connection member 32 to form the U-shaped pillar 30. On the other hand, the control gate electrode CG, the selection gate electrode SG, and the source line SL are aligned in the X direction; and the bit line BL is aligned in the Y direction. Although the arrangement periods of the U-shaped pillar 30 and the control gate electrode CG in the Y direction are the same, the phases are shifted one half-period. Therefore, one pair of the silicon pillars 31 belonging to each of the U-shaped pillars 30, i.e., the two silicon pillars 31 connected to each other by the connection member 32, pierces mutually different control gate electrodes CG. On the other hand, two silicon pillars 31 mutually adjacent in the Y direction and belonging to two U-shaped pillars 30 mutually adjacent in the Y direction pierce a common control gate electrode CG.

The multiple silicon pillars 34 arranged in the Y direction pierce mutually different selection gates SG. Accordingly, one pair of silicon pillars 34 belonging to each of the U-shaped pillars 30 pierces mutually different selection gate electrodes SG. On the other hand, the multiple U-shaped pillars 30 arranged in the X direction pierce a common pair of selection gates SG.

One silicon pillar 34 of the pair of silicon pillars 34 belonging to each of the U-shaped pillars 30 is connected to the source line SL via a source plug SP buried in the insulating film 19; and one other silicon pillar 34 of the pair is connected to the bit line BL via a bit plug BP buried in the insulating films 19 and 20. Accordingly, the U-shaped pillar 30 is connected between the bit line BL and the source line SL. In FIG. 1 to FIG. 4, the selection gate electrode SG pierced by the U-shaped pillar 30 and disposed on the bit line side is illustrated as the selection gate electrode SGb; and the selection gate electrode SG pierced by the U-shaped pillar 30 and disposed on the source line side is illustrated as the selection gate electrode SGs. The U-shaped pillars 30 arranged in the X direction are connected to a common source line SL and to mutually different bit lines BL. Here, the arrangement period of the U-shaped pillar 30 in the X direction is the same as the arrangement period of the bit line BL. Therefore, in the X direction, the U-shaped pillar 30 and the bit line BL correspond one-to-one. On the other hand, two of the U-shaped pillars 30 arranged in the Y direction are connected to each of the source lines SL as one set and are connected to a common bit line BL.

In the device 1 as illustrated in FIG. 1 to FIG. 4, the silicon pillar 31 functions as a channel and the control gate electrode CG functions as a gate electrode. Thereby, a vertical memory transistor 35 is formed at the intersection between the silicon pillar 31 and the control gate electrode CG. Each of the memory transistors 35 functions as a memory cell by the charge storage film 26 disposed between the silicon pillar 31 and the control gate electrode CG storing electrons. In the stacked body ML, the multiple silicon pillars 31 are arranged in a matrix configuration along the X direction and the Y direction. Therefore, the multiple memory transistors 35 are arranged three-dimensionally along the X direction, the Y direction, and the Z direction.

A selection transistor 36 is formed at the intersection between the silicon pillar 34 and the selection gate electrode SG with the silicon pillar 34 as the channel, the selection gate electrode SG as the gate electrode, and the gate insulating film 28 as the gate insulating film. The selection transistor 36 also is a vertical transistor similar to the memory transistor 35 described above.

Further, because the ONO film 24 is interposed between the connection member 32 and the back gate BG, a back gate transistor 37 is formed with the connection member 32 as the channel, the back gate BG as the gate electrode, and the ONO film 24 as the gate insulating film. In other words, the back gate BG functions as an electrode to control the conducting state of the connection member 32 by an electric field.

As a result, as illustrated in FIG. 4, a memory string 38 connected between the bit line BL and the source line SL along each of the U-shaped pillars 30 is formed. In the memory string 38, the selection transistor 36 is provided at both end portions; the back gate transistor 37 is provided in the central portion; and the same number of memory transistors 35 as the number of stacks of the electrode films 14 is connected in series between the back gate transistor 37 and each of the selection transistors 36. In other words, the multiple memory transistors 35 arranged three-dimensionally in the stacked body ML may be collected as the memory string 38 for each of the U-shaped silicon members 33.

As illustrated in FIG. 5, the memory cell array MCA is divided into multiple blocks 50. The positional relationship between the block 50 and each of the conductive members will now be described.

As illustrated in FIG. 5, the multiple blocks 50 set in the memory cell array MCA are arranged along the Y direction. The conductive members provided in the device 1 to align in the X direction, i.e., the control gate electrode CG and the selection gate electrode SG, and the U-shaped pillar 30 aligned in the Z direction are organized into each of the blocks 50. The back gate BG formed along the XY plane is subdivided and mutually separated electrically from each other for each of the blocks 50. On the other hand, the bit line BL aligned in the Y direction extends to pass through all of the blocks 50 and is common to all of the blocks 50. An element separation film (not illustrated) is formed in a region of the silicon substrate 11 between the blocks 50.

The control gate electrodes CG belonging to each of the blocks 50 are organized further into two groups. That is, the control gate electrodes CG are divided into the control gate electrode CG disposed in a region directly below the source line SL and pierced by the silicon pillar having an upper end portion connected to the source line SL (illustrated as a control gate electrode CGs in FIG. 5) and the control gate electrode CG disposed in a region outside of the region directly below the source line SL and pierced by a silicon pillar having an upper end portion connected to the bit line BL (illustrated as a control gate electrode CGb in FIG. 5). The control gate electrodes CGs and the control gate electrodes CGb are alternately arranged along the Y direction; the control gate electrodes CGs are commonly connected to each other; and the control gate electrodes CGb are also commonly connected to each other. The control gate electrodes CGs are electrically separated from the control gate electrodes CGb.

Specifically, as illustrated in FIG. 5, the electrode films 14 (referring to FIG. 1) are not divided along the Y direction at both of the X-direction end portions of the stacked body ML; and incisions aligned in the X direction are made intermittently. Thereby, in each of the blocks 50, the electrode films 14 are subdivided into a pair of mutually meshed comb-shaped patterns to form the control gate electrodes CGs and the control gate electrodes CGb, respectively. Although the control gate electrode CGs has three comb teeth and the control gate CGb has two comb teeth in FIG. 5 to simplify the drawing, this embodiment is not limited thereto, and the number of comb teeth may be higher.

The peripheral circuit unit CCS of the memory chip 7 will now be described with reference to FIG. 1.

The command input/output buffer 81 is a circuit that temporarily stores commands output by the control circuit 71 and outputs the commands to the address buffer 82, the word line drive circuit 84, and the bit line amplifier circuit 86. The address buffer 82 is a circuit that temporarily stores the physical addresses of the memory cells output by the control circuit 71 and outputs the physical addresses to the row decoder 83 and the column decoder 85. The row decoder 83 is a circuit that selects the word lines (the control gate electrodes CG) corresponding to the memory cells based on the physical addresses received from the address buffer 82 and outputs the results to the word line drive circuit 84. The word line drive circuit 84 is a circuit that produces a potential to supply to each of the control gate electrodes CG based on the signal received from the row decoder 83.

The column decoder 85 is a circuit that selects the bit lines BL corresponding to the memory cells based on the physical addresses received from the address buffer 82. The bit line amplifier circuit 86 is a circuit that produces a potential to supply to each of the bit lines BL based on the signal received from the column decoder 85 when writing the data and amplifies the potential of the bit lines BL when reading the data. The data buffer 87 is a circuit that temporarily stores the data read by the bit line amplifier circuit 86 and outputs the data to the error detection unit 72 of the controller chip 6. A drive circuit (not illustrated) that applies a prescribed potential to the selection gate electrodes SG and the back gates BG of the memory cell array MCA also is provided in the peripheral circuit unit CCS.

Operations of the nonvolatile semiconductor memory device 1 according to this embodiment having the configuration described above, that is, the method for driving the nonvolatile semiconductor memory device according to this embodiment, will now be described.

First, operations of the device 1 will be described summarily. Although omitted from the following summary, operations of the interior of the memory cell array MCA are described below in detail.

Figure 6:
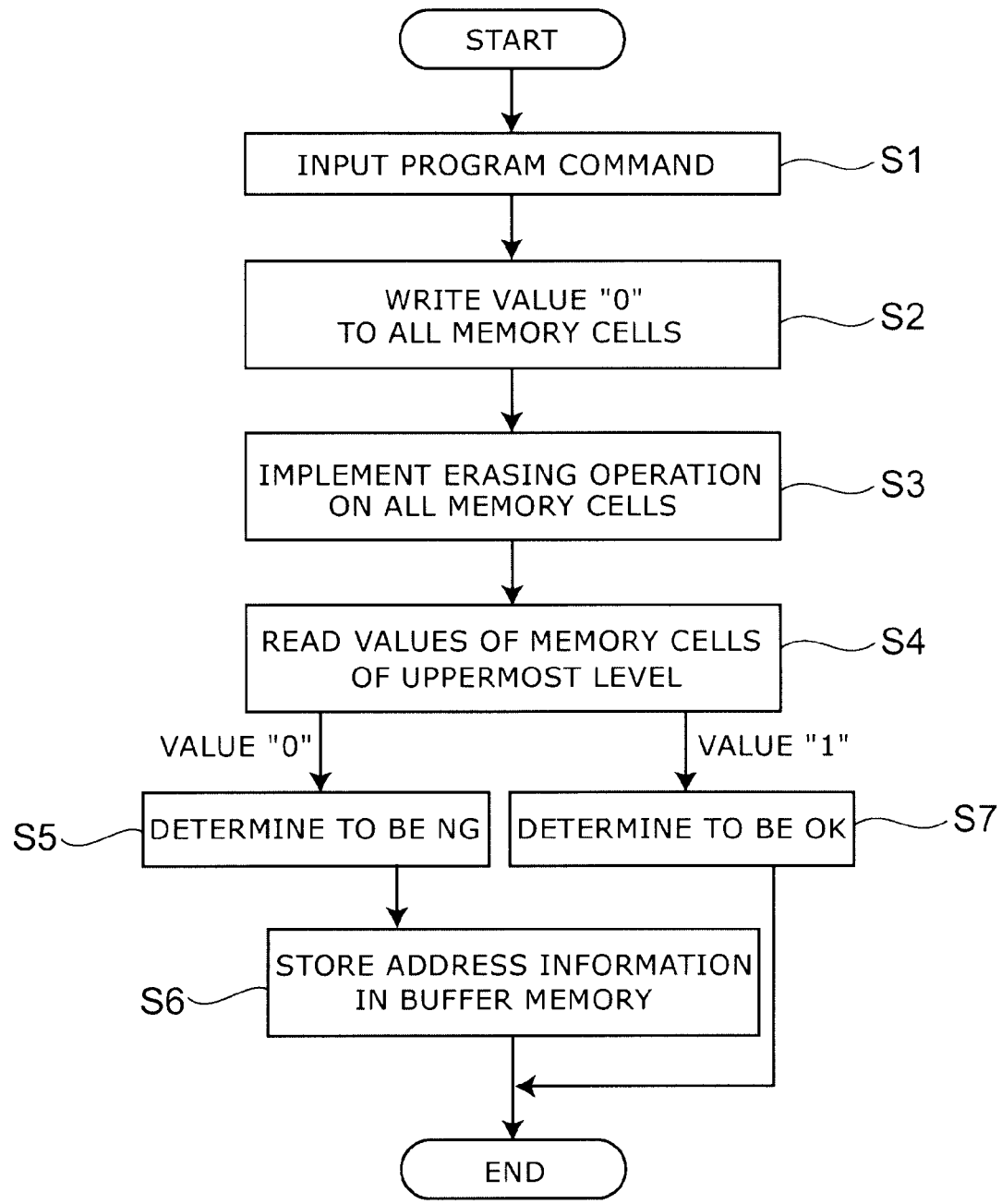
FIG. 6 is a flowchart of operations of the nonvolatile semiconductor memory device according to the first embodiment.

FIG. 6 is a flowchart illustrating operations of the nonvolatile semiconductor memory device according to this embodiment.

First, as illustrated in step S1 of FIG. 1 and FIG. 6, a program command is input to the control circuit 71 of the controller chip 6 from outside the device 1. The program command is, for example, a formatting command of the device 1. Thereby, the control circuit 71 executes step S2 and the subsequent operations.

In other words, as illustrated in step S2, the control circuit 71 writes data having the value "0" to all of the memory cells of the memory cell array MCA. Then, as illustrated in step S3, an erasing operation is implemented on all of the memory cells. At this time, the value of the memory cell is "1" for the memory cells for which the erasing operation was executed normally. On the other hand, the value continues to be "0" for the memory cells for which the erasing operation was not executed normally.

Then, as illustrated in step S4, the control circuit 71 executes a reading operation of the data of the memory cells of the uppermost level. As described above, the through-hole 21 becomes finer downward in the stacked body ML. Therefore, the memory cell formed in the uppermost level of the stacked body ML has a weaker electric field applied to the ONO film 24 than those of the memory cells formed in the levels other than the uppermost level because the through-hole 21 is wider and the curvature of the side face of the through-hole 21 is smaller in the uppermost level. Accordingly, the memory cell of the uppermost level has a higher possibility of operation errors occurring during the erasing operation than the memory cells in the other levels. Therefore, in step S4, the reading operation is performed on the data of only the memory cells of the uppermost level of the stacked body ML.

As a result, the memory cells having a value of "0" are determined in step S5 to be "NG," that is, memory cells for which the erasing operation of step S3 was not executed normally. As illustrated in step S6, address information of the memory cells determined to be "NG" is stored in the buffer memory 73. On the other hand, the memory cells having a value of "1" are determined in step S7 to be "OK," that is, memory cells for which the erasing operation of step S3 was executed normally. The determination operation illustrated in FIG. 6 ends when the reading operation of the data of all of the memory cells of the uppermost level ends.

Thereby, the address information of the memory cells formed in the stacked body ML having operation errors is stored in the buffer memory 73. Thereafter, the memory cells for which address information is stored in the buffer memory 73 are excluded from the processing when the control circuit 71 performs normal writing operations and reading operations. Specifically, when the control circuit 71 sequentially assigns the physical address of each of the memory cells to the logical addresses of the data received from outside the device 1 and when the control circuit 71 sequentially assigns the logical addresses to the physical addresses of the data read from the memory chip 7, the assigning is performed by skipping the physical addresses of the memory cells stored in the buffer memory 73. Thereby, the memory cells having operation errors are excluded; and only normal memory cells are used.

Thus, in this embodiment, the memory cells for which operation errors occur can be excluded; and the reliability of the operations of the nonvolatile semiconductor memory device 1 can be guaranteed. Also, it is unnecessary to allow for an excessive margin when manufacturing the device 1. Therefore, the aspect ratio of the through-holes made by one patterning can be increased. Thereby, it is possible to reduce the cost per bit and the manufacturing costs while maintaining the operational reliability of the device 1.

Operations of the interior of the memory cell array MCA during the writing operation, the erasing operation, and the reading operation described above will now be described in detail.

FIG. 7 illustrates the potentials applied to the electrodes and the interconnections during operations of the nonvolatile semiconductor memory device according to this embodiment.

Figure 8:
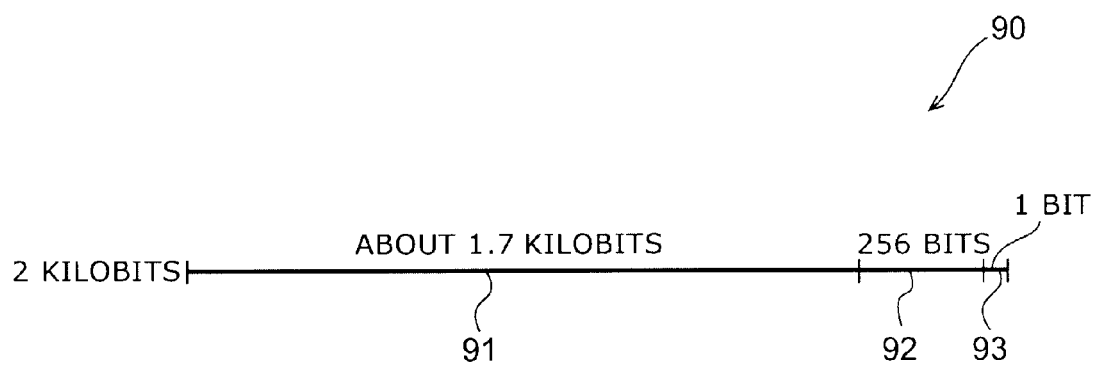
FIG. 8 is a diagram of data created for each memory cell column of the nonvolatile semiconductor memory device according to the first embodiment.

FIG. 8 illustrates the data created for each memory cell column of the nonvolatile semiconductor memory device according to this embodiment.

In the following description, the memory transistor 35 is taken to be an n-channel field effect transistor. In the memory transistor 35, the state in which electrons are stored in the charge storage film 26 and the threshold value is shifted to positive is taken to be the value "0;" and the state in which electrons are not stored in the charge storage film 26 and the threshold value is not shifted is taken to be the value "1." Further, it is taken that in the initial state, electrons are not stored in any of the memory transistors 35. Accordingly, the value "1" is written thereto. The number of levels of the control gate electrodes is taken to be 4. The memory transistor 35 (hereinbelow referred to as "selected cell") to and from which data is to be written and read is taken to be the memory transistor of the third level from the bottom of the silicon pillar having an upper end portion connected to the bit line BL. In other words, the control gate electrode CGb of the third level from the bottom is the gate electrode of the selected cell.

(Writing Operation)

First, writing operations to write any data to each of the memory transistors 35 will be described. The writing of the data is performed for one block at a time in order and is performed simultaneously for multiple selected cells arranged in the X direction. As illustrated in FIG. 2, although these multiple selected cells belong to mutually different memory strings 38, they share the same control gate electrode CG. Also, although the multiple memory strings 38 to which these selected cells belong are connected to mutually different bit lines BL, the multiple memory strings 38 pierce a common selection gate electrode SG and are connected to a common source line SL.

First, the Y coordinate of the memory strings 38 (hereinbelow referred to as "selected strings") of the memory transistors 35 to be written (the selected cells) is selected. Specifically, as illustrated in FIG. 7, the peripheral circuit unit CCS applies a selection gate potential $V_{sg}$ to the selection gate electrode SGb of the selected strings and applies an OFF potential $V_{off}$ to the selection gate electrode SGs. The OFF potential $V_{off}$ is applied to the selection gate electrodes SGb and SGs of the unselected memory strings 38. The OFF potential $V_{off}$ is a potential, e.g., a reference potential Vss, of the gate electrode of the transistor such that the transistor is switched to the OFF state. The reference potential Vss is, for example, a grounding potential (0 V). The selection gate potential $V_{sg}$ is a potential, e.g., a potential higher than the reference potential Vss, of the selection gate electrode SG of the selection transistor 36 such that the conducting state of the selection transistor 36 is determined by the potential of the silicon pillar (the body potential). The potential of the back gate BG is set to be an ON potential $V_{on}$. The ON potential $V_{on}$ is a potential, e.g., a power supply potential Vdd (e.g., 3.0 V), of the gate electrode of the transistor such that the transistor is switched to the ON state.

Thereby, the selection transistors 36 on the bit line side of the selected strings are switched to the ON state and the OFF state by the potential of the bit lines BL; and the selection transistors 36 on the source line side are switched to the OFF state. All of the selection transistors 36 of the unselected memory strings 38 are switched to the OFF state. The back gate transistors 37 of all of the memory strings 38 are switched to the ON state.

Then, the reference potential Vss (e.g., 0 V) is applied to the bit lines BL connected to the selected cells to be written with the value "0;" and the power supply potential Vdd (e.g., 3.0 V) is applied to the bit lines BL connected to the selected cells to be written with the value "1." In step S2 illustrated in FIG. 6, the value "0" is written to all of the memory cells. Therefore, the reference potential Vss is applied to all of the bit lines BL. On the other hand, the power supply potential Vdd is applied to all of the source lines SL.

In this state, the positions of the selected cells of the selected strings are selected. Specifically, the potential of the control gate electrode CG of the selected cells is increased to a writing potential $V_{pgm}$ (e.g., 18 V); and the potential of the other control gate electrodes CG is set to an intermediate potential $V_{pass}$ (e.g., 10 V). At this time, because the control gate electrodes CGb of the layer of the selected cells are connected to each other, the writing potential $V_{pgm}$ is applied to the control gate electrodes CGb of the layer also for the unselected memory strings. The writing potential $V_{pgm}$ is a potential high enough to inject electrons from the silicon pillar 31 into the charge storage film 26 of the ONO film 24, and is a potential higher than the reference potential Vss and the selection gate potential $V_{sg}$. That is, $Vss < V_{sg} < V_{pgm}$. Although the intermediate potential $V_{pass}$ is a potential higher than the reference potential Vss, the intermediate potential $V_{pass}$ is a potential lower than the writing potential $V_{pgm}$. That is, $Vss < V_{pass} < V_{pgm}$.

Thereby, for the selected cells to be written with the value "0," the potential difference between the source potential and the gate potential of the selection transistors 36 on the bit line side exceeds the threshold and the selection transistors 36 are switched to the ON state because the potential of the bit lines BL is the reference potential Vss (e.g., 0 V) and the potential of the selection gate electrode SGb on the bit line side is the selection gate potential $V_{sg}$ which is higher than the reference potential Vss. As a result, a body potential $V_{body}$ of the selected cells approaches the reference potential Vss. The potential of the control gate electrode CG of the selected cells is the writing potential $V_{pgm}$ (e.g., 18 V). Accordingly, the difference $(V_{pgm} - V_{body})$ between the gate potential and the body potential of the selected cells is sufficiently large; high-temperature electrons are produced by the potential difference; and the electrons are injected from the silicon pillar 31 into the charge storage film 26 via the tunneling film 27. Thereby, the value "0" is written into the selected cells. In step S2 illustrated in FIG. 6, the value "0" is written to all of the memory cells.

On the other hand, for the selected cells to be written with the value "1," the potential of the bit lines BL is the positive potential Vdd (e.g., 3.0 V) and the potential of the selection gate electrode SGb on the bit line side is the selection gate potential $V_{sg}$ which is higher than the reference potential Vss. Therefore, the potential difference between the source potential and the gate potential of the selection transistors 36 on the bit line side is small, and the selection transistors 36 are switched to the OFF state by a back gate effect. Thereby, the silicon pillars 31 are in a floating state and the body potential $V_{body}$ of the selected cells is maintained at a high value by coupling with the control gate electrodes CG provided with the intermediate potential $V_{pass}$ (e.g., 10 V). Therefore, the difference $(V_{pgm} - V_{body})$ between the writing potential $V_{pgm}$ (e.g., 18 V) of the control gate electrode CG of the selected cells and the body potential $V_{body}$ decreases, and electrons are not injected into the charge storage film 26. As a result, the value "1" is written to the selected cells.

For the unselected memory strings 38, the potential of the silicon pillars 31 is in a floating state because the selection transistors 36 at both of the end portions are switched to the OFF state. In such a case, the body potential $V_{body}$ of the silicon pillars 31 can be controlled by the potential applied to the control gate electrodes CG, the voltage increase rate thereof, and the potential of the selection gate electrodes SG; and a high potential can be maintained. As a result, the difference $(V_{pgm} - V_{body})$ between the gate potential and the body potential of the memory transistors 35 decreases, electrons are not injected into the charge storage film 26, and the initial value is maintained.

Thus, in this embodiment, the writing row (the Y coordinate) is selected by controlling the conducting state of the selection transistors, and data is written to the memory strings 38 arranged in the X direction in order by row. At this time, the potential of the control gate electrodes is controlled by block. Therefore, for the writing disturbance, it is sufficient to consider the total time necessary for writing the data to the memory strings in the block. Thereby, the disturbance time can be controlled by adjusting the block size.

(Erasing Operation)

An erasing operation in which data written to the memory transistor is erased will now be described. The unit of erasing data is by block. As illustrated in FIG. 7, the peripheral circuit unit CCS applies the ON potential $V_{on}$ to the back gate BG, and the back gate transistors 37 are switched to the ON state. The reference potential Vss (e.g., 0 V) is applied to all of the control gate electrodes CG of the block to be erased (hereinbelow referred to as "selected block"). The potentials of the bit lines BL and the source lines SL are increased to an erasing potential $V_{erase}$ (e.g., 15 V). Also, the selection gate potential $V_{sg}$ which is lower than the erasing potential $V_{erase}$ is applied to the selection gate electrodes SGb and SGs. That is, $V_{sg} < V_{erase}$.

Thereby, the potential of the bit lines BL and the source lines SL is the erasing potential $V_{erase}$ (e.g., 15 V), and the potential of the selection gate electrodes SGb and SGs is the selection gate potential $V_{sg}$. Therefore, a hole current is produced by tunneling between bands due to the potential difference between the bit lines BL and the selection gate electrodes SGb and the potential difference between the source lines SL and the selection gate electrodes SGs; and the potential of the silicon pillars 31, i.e., the body potential, increases. On the other hand, the reference potential Vss (e.g., 0 V) is applied to the control gate electrodes CG of the block to be erased (the selected block). Therefore, holes are injected into the charge storage films 26 of the memory transistors 35 due to the potential difference between the silicon pillars 31 and the control gate electrodes CG, and electrons in the charge storage film 26 undergo pair annihilation. As a result, the data is erased.

However, because the diameter of the through-hole 21 is large for the memory transistor 35 formed in the uppermost level, the curvature of the side face of the through-hole 21 is small; and in some cases, the electric field between the silicon pillar 31 and the control gate electrode CG may be insufficient. In such a case, a sufficient amount of holes is not injected into the charge storage film 26; and the erasing is insufficient. Although it is necessary for the potential difference between the erasing potential $V_{erase}$ and the selection gate potential $V_{sg}$ to be sufficient to inject enough holes into the charge storage film 26 because the body potential increases due to the injection of the hole current, it is also necessary to adjust such that the gate insulating film 28 of the selection transistor 36 is not destructed due to an excessive potential difference.

On the other hand, for the blocks not to be erased (the unselected blocks), the potential of the selection gate electrodes SGb and SGs is increased to a potential approaching the potential of the bit lines BL and the source lines SL, and the electric field between a diffusion layer connected to the bit lines BL or the source lines SL and the selection gate electrodes SGb or SGs is reduced so that a hole current is not produced. Or, the potential of the control gate electrodes CG is increased simultaneously with that of the silicon pillars 31 so that holes in the silicon pillars 31 are not injected into the charge storage films 26. Thereby, the values already written to the memory transistors 35 of the unselected blocks are maintained as-is.

(Reading Operation)

A reading operation in which the data written to any of the memory transistors 35 is read will now be described. As illustrated in FIG. 7, the peripheral circuit unit CCS applies the ON potential $V_{on}$ to the back gate BG, and the back gate transistors 37 are switched to the ON state. The ON potential $V_{on}$ (e.g., 3.0V) is applied to the selection gate electrodes SGs and SGb of the selected strings, and the selection transistors 36 are switched to the ON state. On the other hand, the OFF potential $V_{off}$ (e.g., 0 V) is applied to the selection gate electrodes SGs and SGb of the unselected memory strings 38, and the selection transistors 36 are switched to the OFF state.

The peripheral circuit unit CCS applies a potential to the control gate electrode CG of the selected cells, e.g., the control gate electrode CGb of the third layer from the bottom, such that the conducting state differs due to the value of the selected cells. The potential is, for example, the reference potential Vss (e.g., 0 V) and is a potential such that a current does not flow in the body in the case where the value of the selected cell is "0," i.e., when electrons are stored in the charge storage film 26 and the threshold is shifted to positive, and a current flows in the body in the case where the value of the selected cell is "1," i.e., when electrons are not stored in the charge storage film 26 and the threshold is not shifted. For the memory transistors 35 other than those of the selected cells, a reading potential $V_{read}$ (e.g., 4.5 V) is applied to the control gate electrodes thereof so that the memory transistors 35 are switched to the ON state regardless of the values thereof.

In this state, a potential Vb1 (e.g., 0.7 V) is applied to each of the bit lines BL, and the reference potential Vss (e.g., 0 V) is applied to each of the source lines SL. As a result, a current flows in the selected string if the value of the selected cell is "1" and a current does not flow in the selected string if the value of the selected cell is "0." Accordingly, the value of the selected cell can be read by detecting the current flowing in the source line SL from the bit line BL via the selected string or by detecting the potential drop of the bit line BL. For example, because the potential of the bit line BL changes when the value of the selected cell is "1," the change is amplified by the bit line amplifier circuit 86 and detected; and the detection result is stored as data in the data buffer 87. For the unselected memory strings 38, a current does not flow regardless of the values stored in the memory transistors 35 because the selection transistors 36 are in the OFF state.

Thus, data is read simultaneously from a memory cell column A made of multiple memory cells arranged in one column along the X direction, that is, the multiple memory cells belonging to multiple memory strings 38 piercing common selection gate electrodes SGs and SGb having a common control gate electrode CG, e.g., the control gate electrode CGb of the third layer from the bottom. Hereinbelow, the collection of the data stored in the memory cell column A is referred to as stored data 91.

As illustrated in FIG. 8, the data buffer 87 adds an ECC (error correcting code) 92 to the stored data 91 read from the memory cell column A and outputs the result to the error detection unit 72. The error detection unit 72 determines whether or not an error exists in the stored data 91 of the received data based on the ECC 92. In the case where no error exists, the data is stored as-is in the buffer memory 73. In the case where an error exists, the error is corrected if the error is correctable and then the data is stored in the buffer memory 73. The control circuit 71 reads the data from the buffer memory 73, converts the physical addresses of the stored data 91 into logical addresses; and outputs to the outside of the device 1.

During the determination operation illustrated in FIG. 6, the control circuit 71 adds the result of the determination to the stored data 91 corresponding to each of the memory cell columns A as a determination result 93. The determination result 93 is, for example, one-bit data. For example, the entire size of data 90 corresponding to one of the memory cell columns A is about 2 kilobits; thereof, the size of the stored data 91 is about 1.7 kilobits; the size of the ECC 92 is 256 bits; and the size of the determination result 93 is 1 bit. In the case where it is determined that one or more of the memory cells of the one memory cell column A has an error (NG) during the determination operation illustrated in FIG. 6, the control circuit 71 sets the value of the determination result 93 of the memory cell column A to a value to indicate an error, e.g., "1." On the other hand, in the case where no memory cells of the memory cell column A are determined to have an error, the value of the determination result 93 of the memory cell column A is set to a value to indicate normality, e.g., "0."

Then, during subsequent writing operations and reading operations, the control circuit 71 first reads the determination result 93 of the data 90; the data 90 for which the value of the determination result 93 is "1" is not to undergo reading operations; and the memory cell column A corresponding to the data 90 is not to undergo writing operations. Specifically, during the writing operation, the control circuit 71 skips the physical addresses of the memory cell column A for which the value of the determination result 93 is "1" and does not assign logical addresses to such physical addresses when sequentially assigning the physical address of each of the memory cells to the logical addresses of the data received from outside the device 1. During the reading operation, the control circuit 71 skips the data 90 for which the value of the determination result 93 is "1" and does not read such data 90 when sequentially assigning the logical addresses to the physical addresses of the data read from the memory chip 7.

Thus, according to this embodiment, it can be determined whether or not to process the data 90 or the memory cell column A by reading only the first bit of the data 90. Therefore, the determination can be made in a short time interval; and high-speed operations are possible.

Although an example is illustrated in this embodiment in which only the memory cells formed in the uppermost level of the stacked body ML are to undergo the determination, the invention is not limited thereto. All of the memory cells may undergo the determination. In the case where only some of the memory cells are to undergo the determination, it is effective for the memory cells having a high possibility of operation errors to be preferentially set to undergo the determination. In other words, in addition to the method in which only the memory cells formed in the uppermost level are to undergo the determination, considering that the through-hole has a circular columnar configuration approaching an inverted circular-cone in which the upper portion of the through-hole is wide and the lower portion is fine, it is conceivable to use a method in which, for example, the memory cells formed in the uppermost level and the second level from the top are to undergo the determination.

Although an example is illustrated in this embodiment in which the value "0" is written to all of the memory cells in step S2 illustrated in FIG. 6 and the erasing operation is implemented on all of the memory cells in step S3, it is sufficient for the writing operation and the erasing operation described above to be performed only for the memory cells set to undergo at least the determination operation in the case where only the determination operation is implemented and the formatting operation is not implemented.

Although an example is illustrated in this embodiment in which it is determined whether or not to perform subsequent writing operations and reading operations based on the determination result for a unit of multiple memory cells that are read simultaneously, i.e., the memory cell column A made of multiple memory cells arranged in one column along the X direction, the invention is not limited thereto. For example, it may be determined whether or not to perform subsequent writing operations and reading operations for a unit of multiple memory cells arranged in a planar configuration along the X direction and the Z direction, i.e., the multiple memory cells sharing each of the multiple silicon pillars 31 arranged along the X direction. Alternatively, it may be determined whether or not to perform subsequent writing operations and reading operations for a unit of the entire block 50.

In the data 90, a CRC (cyclic redundancy check) may be added as an error code to the stored data 91 in addition to the ECC 92 and the determination result 93. Moreover, the execution of the determination operation described above is not limited to the formatting, and may be executed when the product is shipped.

A second embodiment will now be described.

Figure 9:
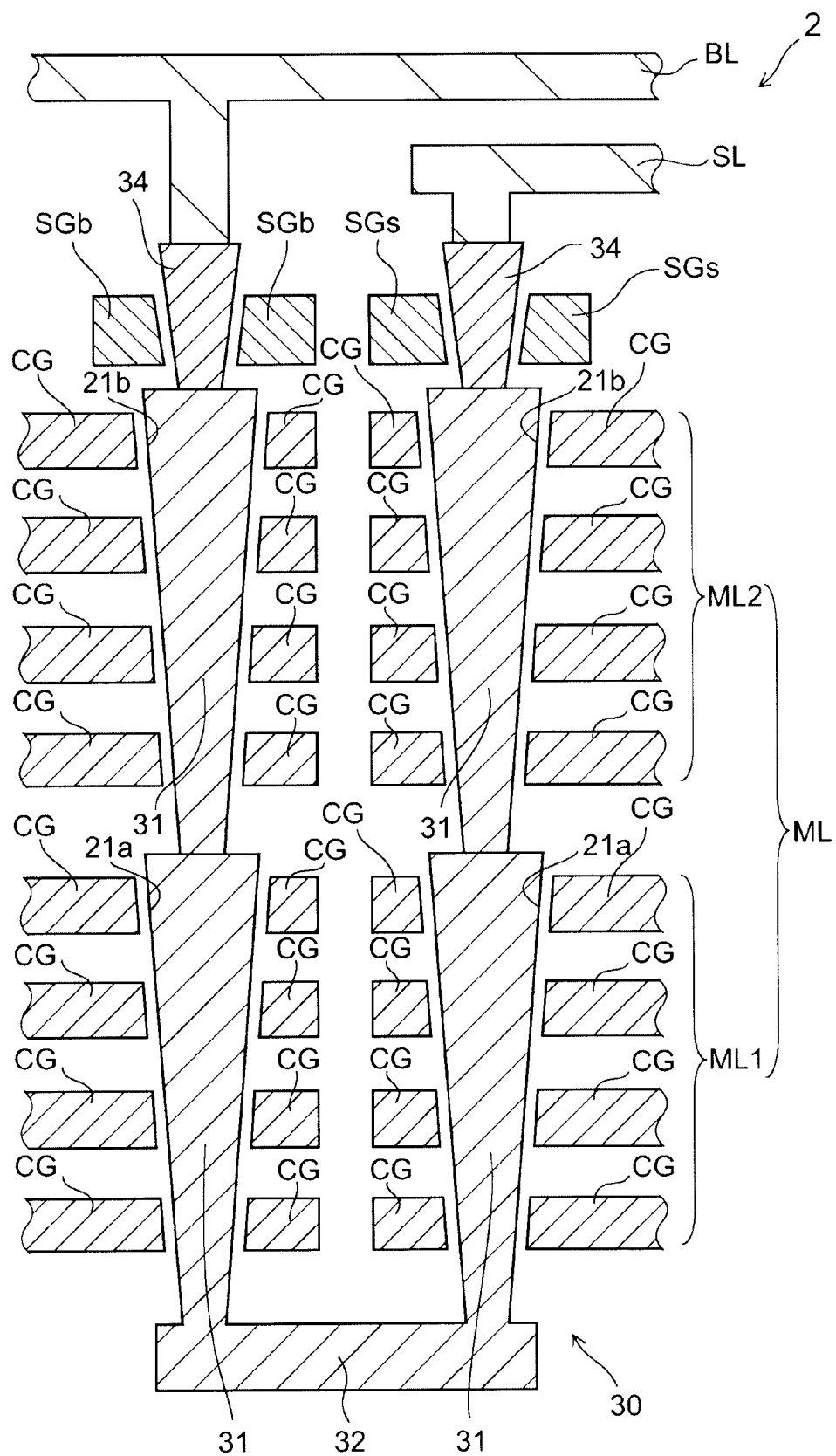
FIG. 9 is a schematic cross-sectional view of a nonvolatile semiconductor memory device according to a second embodiment.

FIG. 9 is a schematic cross-sectional view illustrating a nonvolatile semiconductor memory device according to this embodiment.

In a nonvolatile semiconductor memory device 2 according to this embodiment as illustrated in FIG. 9, the through-hole has a two-level configuration. In each level, the through-hole becomes finer downward. In other words, the stacked body ML is made of two partial stacked bodies ML1 and ML2 arranged in the Z direction; and the partial stacked body ML2 is stacked on the partial stacked body ML1. Multiple insulating films 15 and multiple electrode films 14 are stacked in each of the partial stacked bodies ML1 and ML2. Each of a lower portion 21a of the through-hole 21 made in the partial stacked body ML1 and an upper portion 21b made in the partial stacked body ML2 have a tapered configuration that becomes finer downward. Therefore, the upper end portion of the lower portion 21a is wider than the lower end portion of the upper portion 21b; and a step is formed in the inner face of the through-hole 21 at the boundary portion between the lower portion 21a and the upper portion 21b. The control circuit 71 (referring to FIG. 1) performs the determination operation described above for the memory cells of the uppermost level of each of the partial stacked bodies ML1 and ML2. Otherwise, the configuration, operations, and effects of this embodiment are similar to those of the first embodiment described above. Three or more levels of the partial stacked bodies may be stacked. In such a case as well, it is sufficient for the control circuit 71 to perform the determination operation described above for the memory cells of the uppermost level of each of the partial stacked bodies.

A third embodiment will now be described.

This embodiment is an embodiment of a method for manufacturing the nonvolatile semiconductor memory device 1 according to the first embodiment described above.

The method for manufacturing the memory chip 7 will now be described.

FIG. 10 to FIG. 18 are cross-sectional views of processes, illustrating the method for manufacturing the memory chip of the nonvolatile semiconductor memory device according to this embodiment.

FIG. 10 to FIG. 18 illustrate the same cross section as that of FIG. 3.

Figure 10:
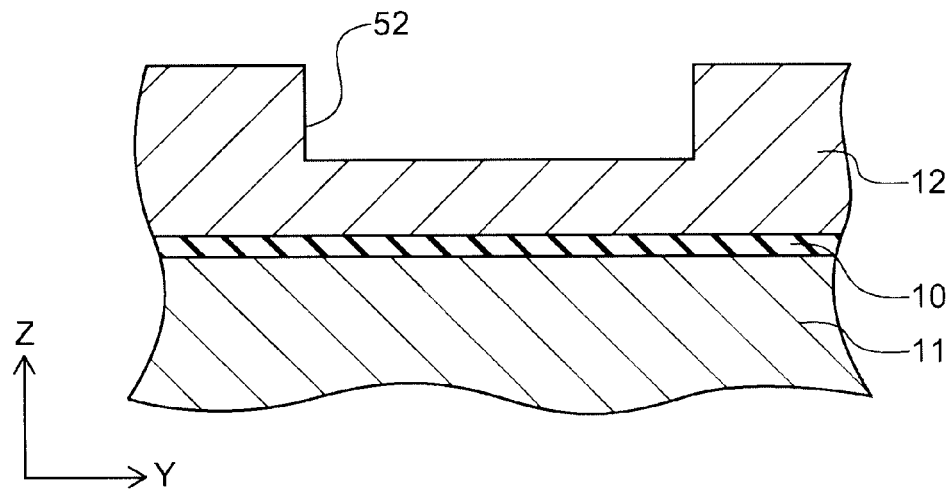
FIG. 10 is a cross-sectional view of processes of a method for manufacturing a memory chip of a nonvolatile semiconductor memory device according to a third embodiment.

First, as illustrated in FIG. 10, the silicon substrate 11 is prepared. A formation region of the memory cell array MCA is set in the silicon substrate 11. A formation region of the peripheral circuit unit CCS is set around the formation region of the memory cell array MCA. An element separation film is formed in a prescribed region of the upper layer portion of the silicon substrate 11. Then, a thick film gate insulating film for high breakdown voltage transistors and a thin film gate insulating film for low breakdown voltage transistors are made separately in the formation region of the peripheral circuit unit CCS. At this time, the insulating film 10 is formed on the silicon substrate 11 also in the formation region of the memory cell array MCA.

Then, the polysilicon film 12 is deposited on the insulating film 10 as a conductive film with a thickness of, for example, 200 nm. Photolithography and RIE (Reactive Ion Etching) are performed on the upper layer portion of the polysilicon film 12 in the memory cell formation region to make multiple trenches 52 having rectangular configurations aligned in the Y direction on the upper face of the polysilicon film 12. The trenches 52 are arranged in a matrix configuration along the X direction and the Y direction. The trenches 52 are recesses made in the upper face of the polysilicon film 12.

Figure 11:
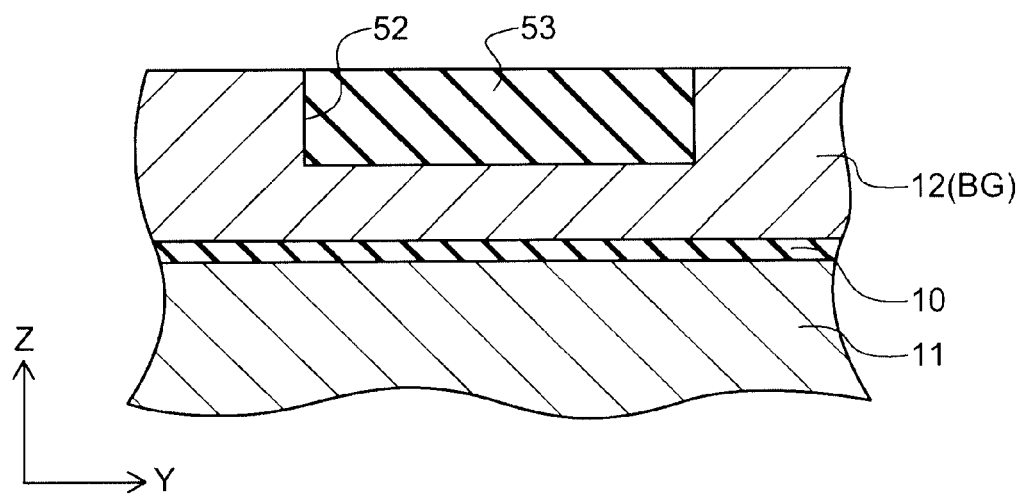
FIG. 11 is a cross-sectional view of processes of the method for manufacturing the memory chip of the nonvolatile semiconductor memory device according to the third embodiment.

Continuing as illustrated in FIG. 11, a silicon nitride film is deposited by, for example, CVD (Chemical Vapor Deposition) to form a sacrificial film 53 on the polysilicon film 12. At this time, the sacrificial film 53 also is filled into the trenches 52. Then, the sacrificial film 53 and the polysilicon film 12 are patterned by, for example, photolithography and RIE. Thereby, the polysilicon film 12 in the memory cell formation region is divided for every block 50 (referring to FIG. 5); the back gates BG made of the polysilicon film 12 are formed in flat-plate configurations in each of the blocks 50; and gate electrodes made of the polysilicon film 12 are formed in the formation region of the peripheral circuit unit CCS.

Subsequently, a spacer made of silicon oxide is formed and a diffusion layer is formed by ion implantation in the formation region of the peripheral circuit unit CCS. Then, an inter-layer insulating film is deposited, planarized, and recessed such that the upper face thereof is the same height as the upper face of the polysilicon film 12. Then, the sacrificial film 53 is recessed such that the sacrificial film 53 is removed from the polysilicon film 12 and left only in the interiors of the trenches 52.

Figure 12:
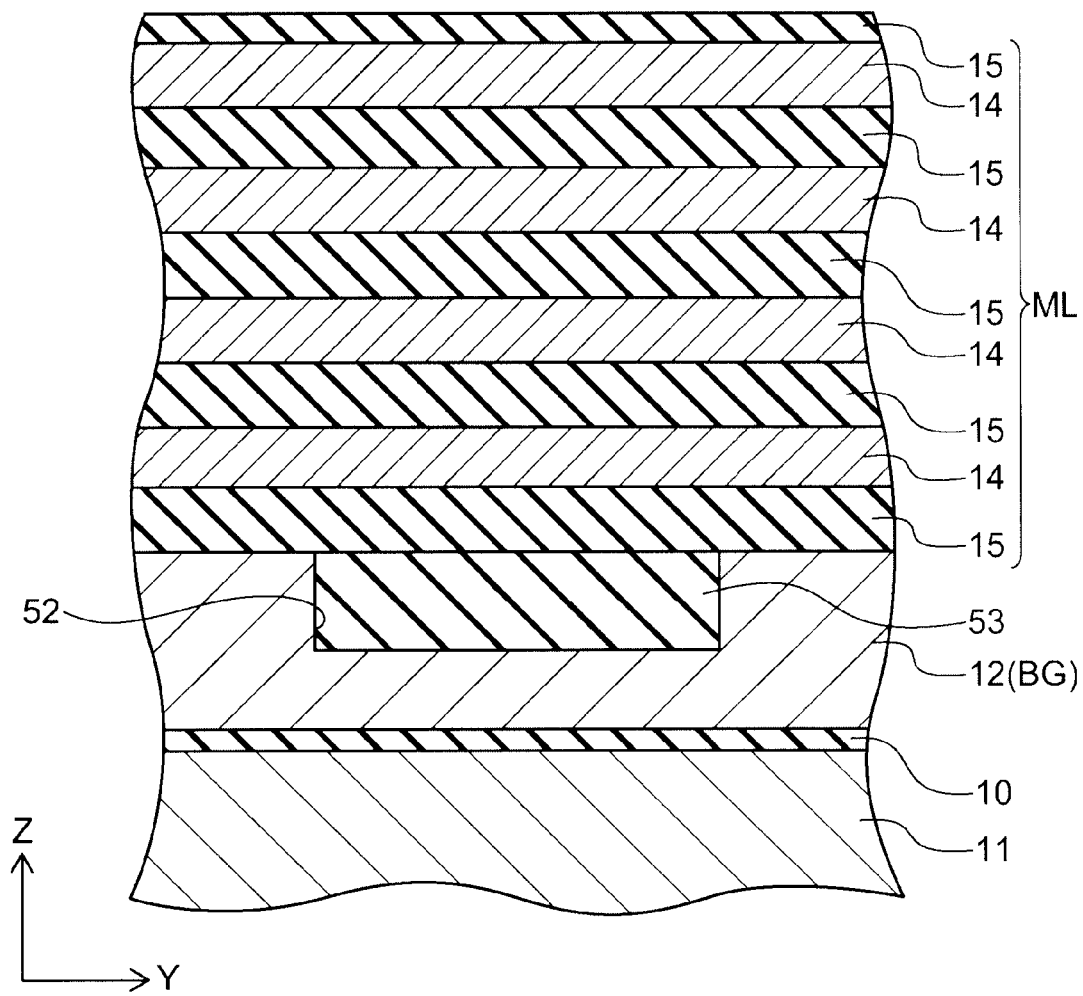
FIG. 12 is a cross-sectional view of processes of the method for manufacturing the memory chip of the nonvolatile semiconductor memory device according to the third embodiment.

Continuing as illustrated in FIG. 12, the insulating films 15 made of, for example, silicon oxide are deposited alternately with the electrode films 14 made of, for example, polysilicon on the back gate BG (the polysilicon film 12) in the formation region of the memory cell array MCA to form the stacked body ML.

Figure 13:
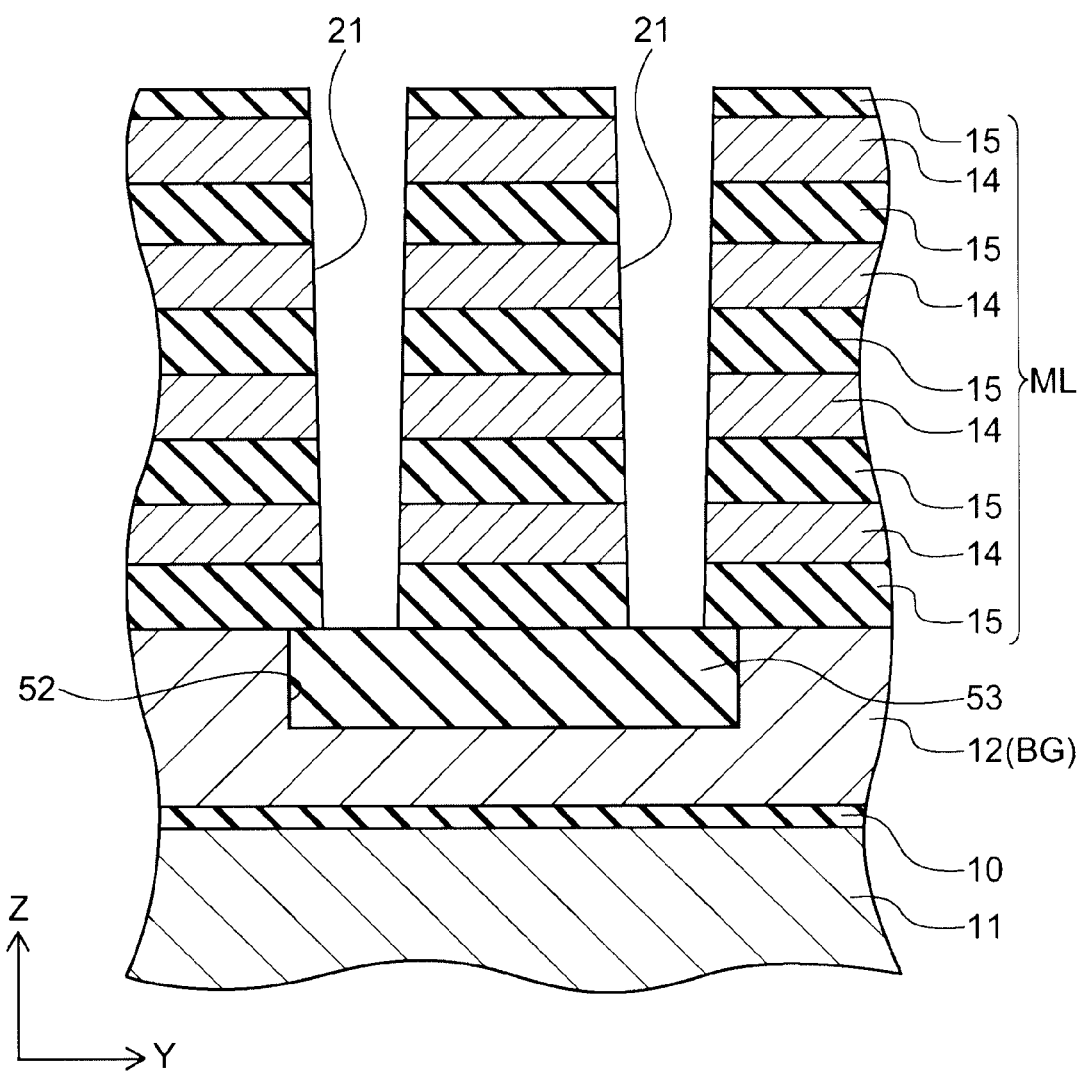
FIG. 13 is a cross-sectional view of processes of the method for manufacturing the memory chip of the nonvolatile semiconductor memory device according to the third embodiment.

Then, as illustrated in FIG. 13, the multiple through-holes 21 are collectively made in the stacked body ML by, for example, RIE to align in the Z direction. The through-holes 21 are arranged in a matrix configuration along the X direction and the Y direction. Also, the bottom portions of the through-holes 21 reach both end portions of the sacrificial films 53 filled into the trenches 52. Thereby, two through-holes 21 adjacent to each other in the Y direction reach each of the sacrificial members 53. The through-hole 21 has a circular configuration as viewed from the Z direction. At this time, the inner side face of the through-hole 21 unavoidably has a tapered configuration inclined with respect to the Z direction. As a result, the through-hole 21 is made in an inverted circular-conic trapezoidal configuration becoming finer downward such that the upper end portion is the widest.

Figure 14:
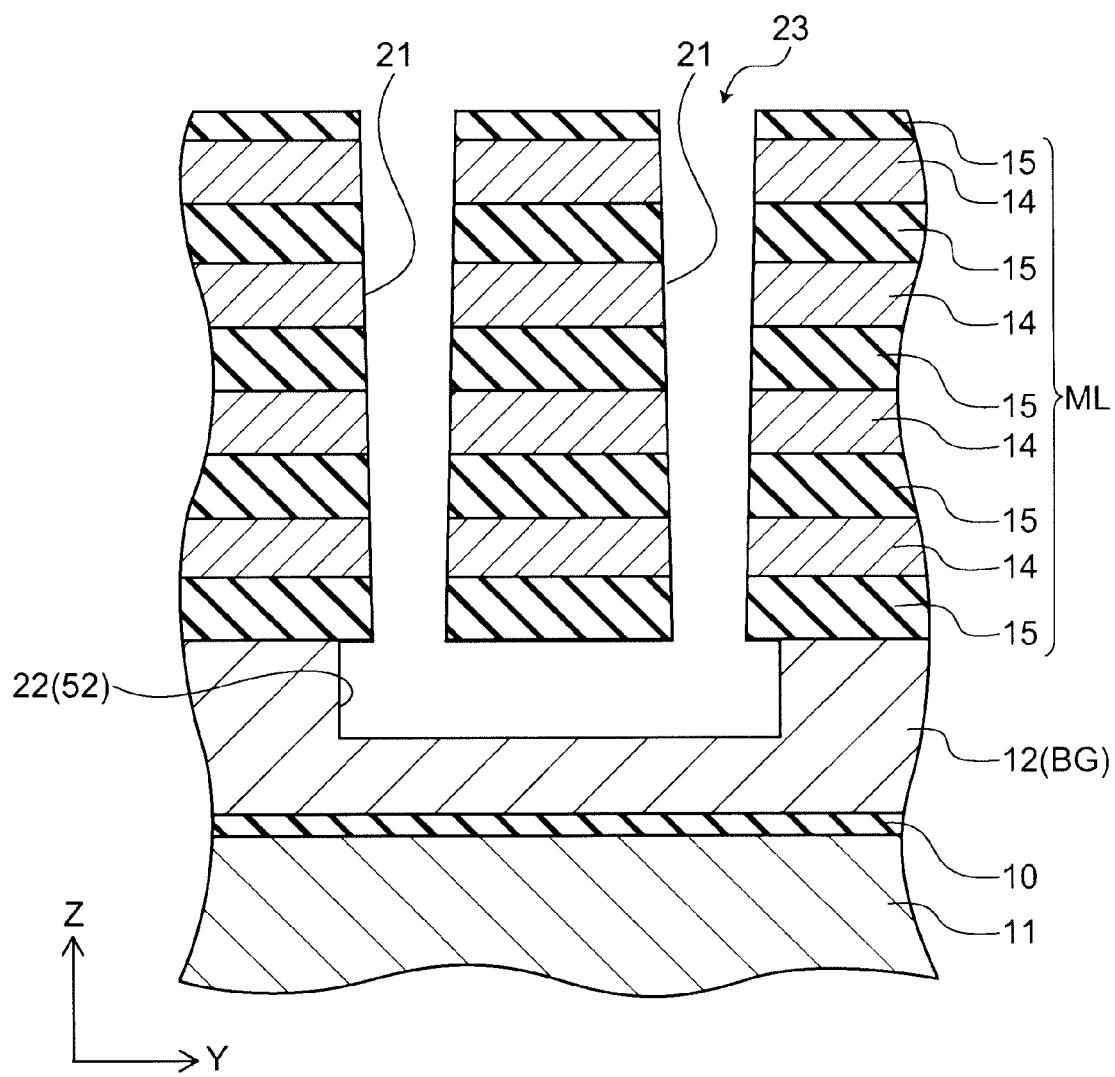
FIG. 14 is a cross-sectional view of processes of the method for manufacturing the memory chip of the nonvolatile semiconductor memory device according to the third embodiment.

Continuing as illustrated in FIG. 14, wet etching is performed via the through-holes 21 to remove the sacrificial film 53 (referring to FIG. 13) from the trenches 52. Thereby, the trench 52 becomes the communicating hole 22; and one continuous U-shaped hole 23 is formed of the communicating hole 22 and the two through-holes 21 communicating with the end portions thereof.

Figure 15:
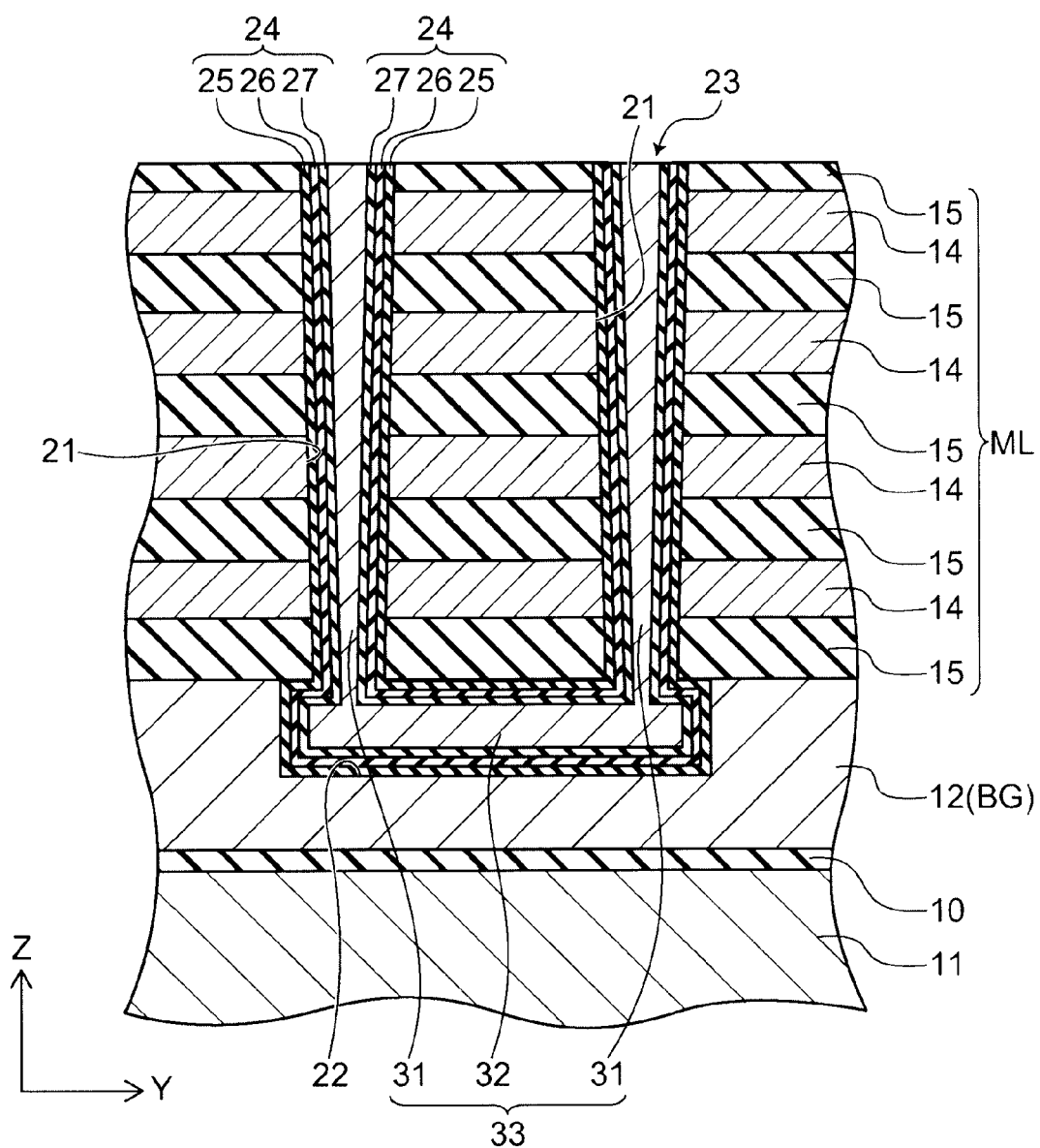
FIG. 15 is a cross-sectional view of processes of the method for manufacturing the memory chip of the nonvolatile semiconductor memory device according to the third embodiment.

Then, as illustrated in FIG. 15, a barrier film (not illustrated) made of, for example, silicon nitride is formed; and subsequently, a silicon oxide film, a silicon nitride film, and a silicon oxide film are continuously deposited. Thereby, the blocking film 25 made of the silicon oxide film, the charge storage film 26 made of the silicon nitride film, and the tunneling film 27 made of the silicon oxide film are stacked in this order on the inner face of the U-shaped hole 23 via the barrier film to form the ONO film 24.

Then, amorphous silicon is deposited on the entire surface. Thereby, amorphous silicon is filled into the U-shaped hole 23 to form the U-shaped silicon member 33. The U-shaped silicon member 33 is formed from the pair of silicon pillars 31 filled into the through-holes 21 and the one connection member 32 filled into the communicating hole 22. Subsequently, the amorphous silicon, the silicon oxide film, the silicon nitride film, and the silicon oxide film deposited on the stacked body ML are removed.

Figure 16:
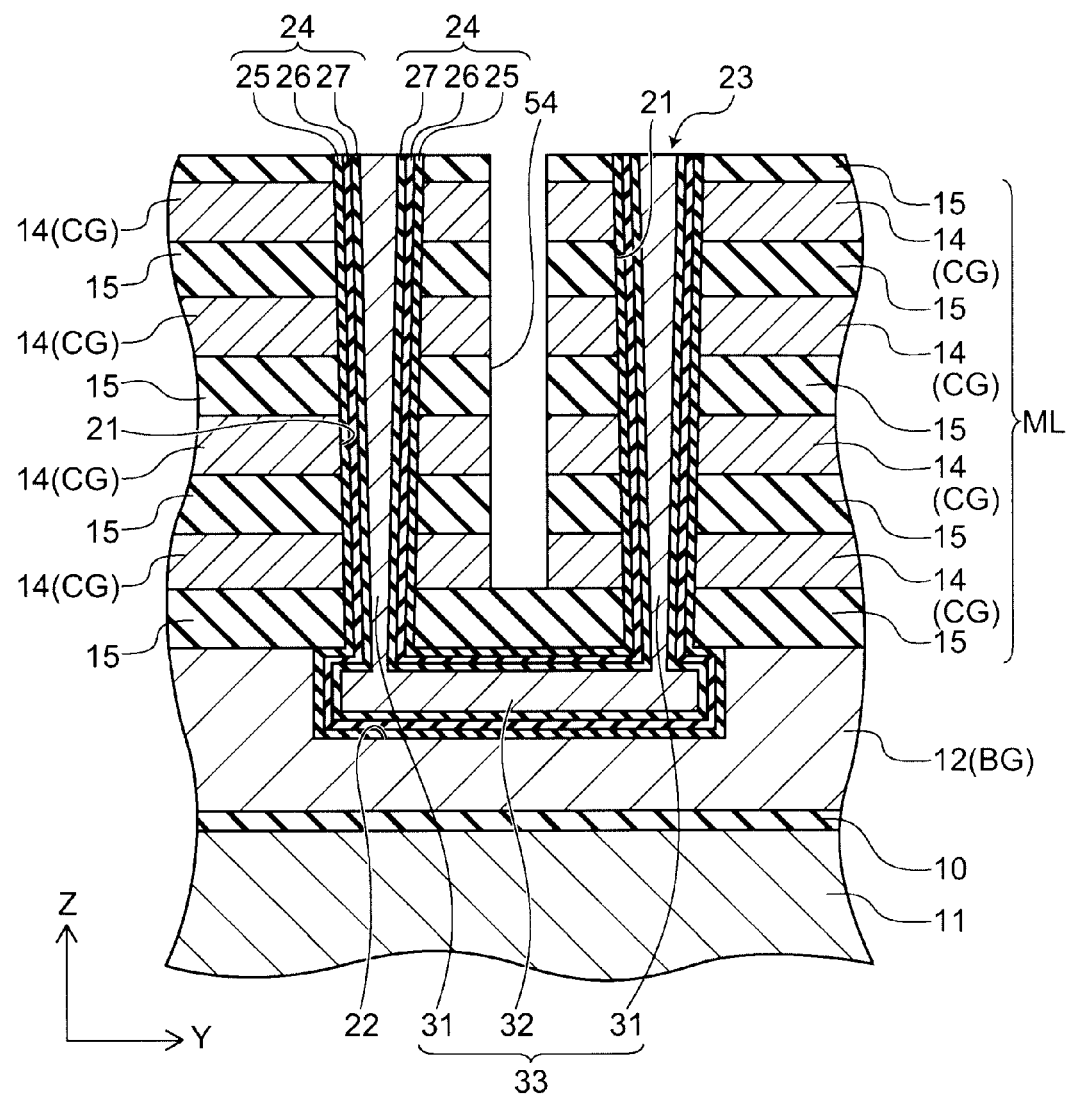
FIG. 16 is a cross-sectional view of processes of the method for manufacturing the memory chip of the nonvolatile semiconductor memory device according to the third embodiment.

Continuing as illustrated in FIG. 16, the stacked body ML is patterned by, for example, RIE to make trenches 54 in the stacked body ML. The trench 54 is made to align in the X direction to link the regions between the two silicon pillars 31 connected to the connection member 32 and reach the insulating film 15 of the lowermost layer.

At this time, as illustrated in FIG. 5, the trenches 54 are made to divide the electrode films 14 into a pair of mutually meshed comb-shaped patterns. In other words, the trenches 54 are made in the X-direction central portion of the stacked body ML to align in the X direction. Thereby, the electrode films 14 are divided into multiple control gate electrodes CG aligned in the X direction. At this time, the trenches 54 are not made in the regions directly above the regions between the connection members 32 in the Y direction. Thereby, each of the control gate electrodes CG is pierced by two of the silicon pillars 31 arranged along the Y direction. At both X-direction end portions of the stacked body ML, the trenches 54 are not aligned in the X direction and are made to align intermittently in the Y direction. Thereby, the control gate electrodes CGb and CGs alternately disposed along the Y direction at the X-direction central portion of the stacked body ML have common connections to each other at each of the X-direction end portions of the stacked body ML.

Figure 17:
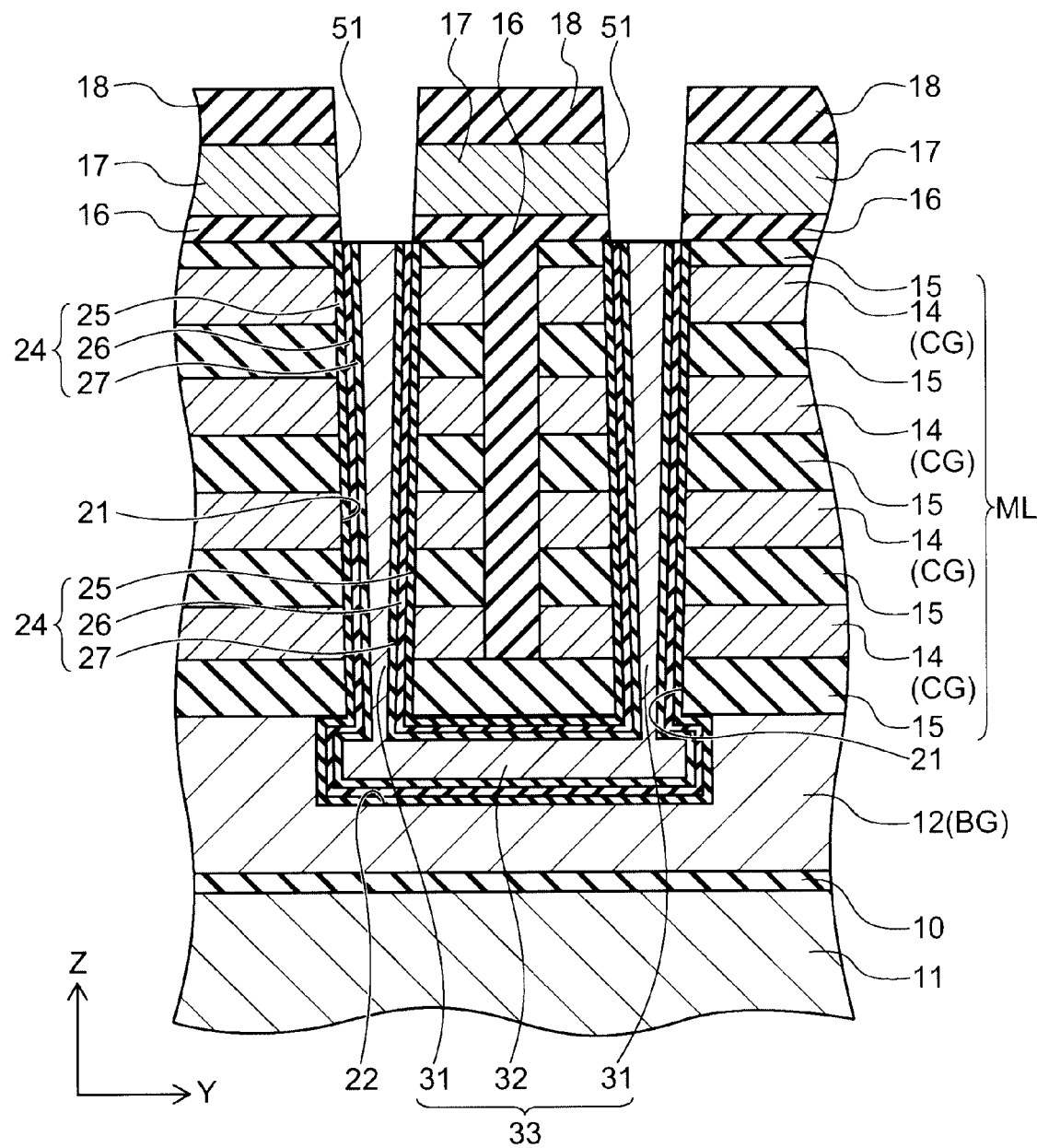
FIG. 17 is a cross-sectional view of processes of the method for manufacturing the memory chip of the nonvolatile semiconductor memory device according to the third embodiment.

Then, as illustrated in FIG. 17, an insulating film 16 is deposited on the stacked body ML and planarized. The insulating film 16 also is filled into the trenches 54. Then, the conductive film 17 made of, for example, amorphous silicon is deposited, etched, and left only in the memory cell region.

Then, a resist film (not illustrated) is formed, for example, on the conductive film 17; and the stacked body ML is patterned into a stairstep configuration by repeatedly performing etching using the resist film as a mask and performing slimming of the resist film. Thereby, both X-direction end portions of the control gate electrodes CG for each level are not covered with the control gate electrodes CG of the level thereabove as viewed from above (the Z direction); and in subsequent processes, contacts can be formed from above to the control gate electrodes CG of each level. Then, an etching stopper film (not illustrated) made of, for example, silicon nitride is formed to cover the stacked body ML patterned into the stairstep configuration; an inter-layer insulating film (not illustrated) is formed thereupon; and the upper face is planarized. Thereby, the inter-layer insulating film is filled around the stacked body ML.

Subsequently, the insulating film 18 is formed on the conductive film 17. The through-holes 51 are made to pierce the insulating film 18, the conductive film 17, and the insulating film 16 to reach the upper ends of the through-holes 21 in the stacked body ML.

Figure 18:
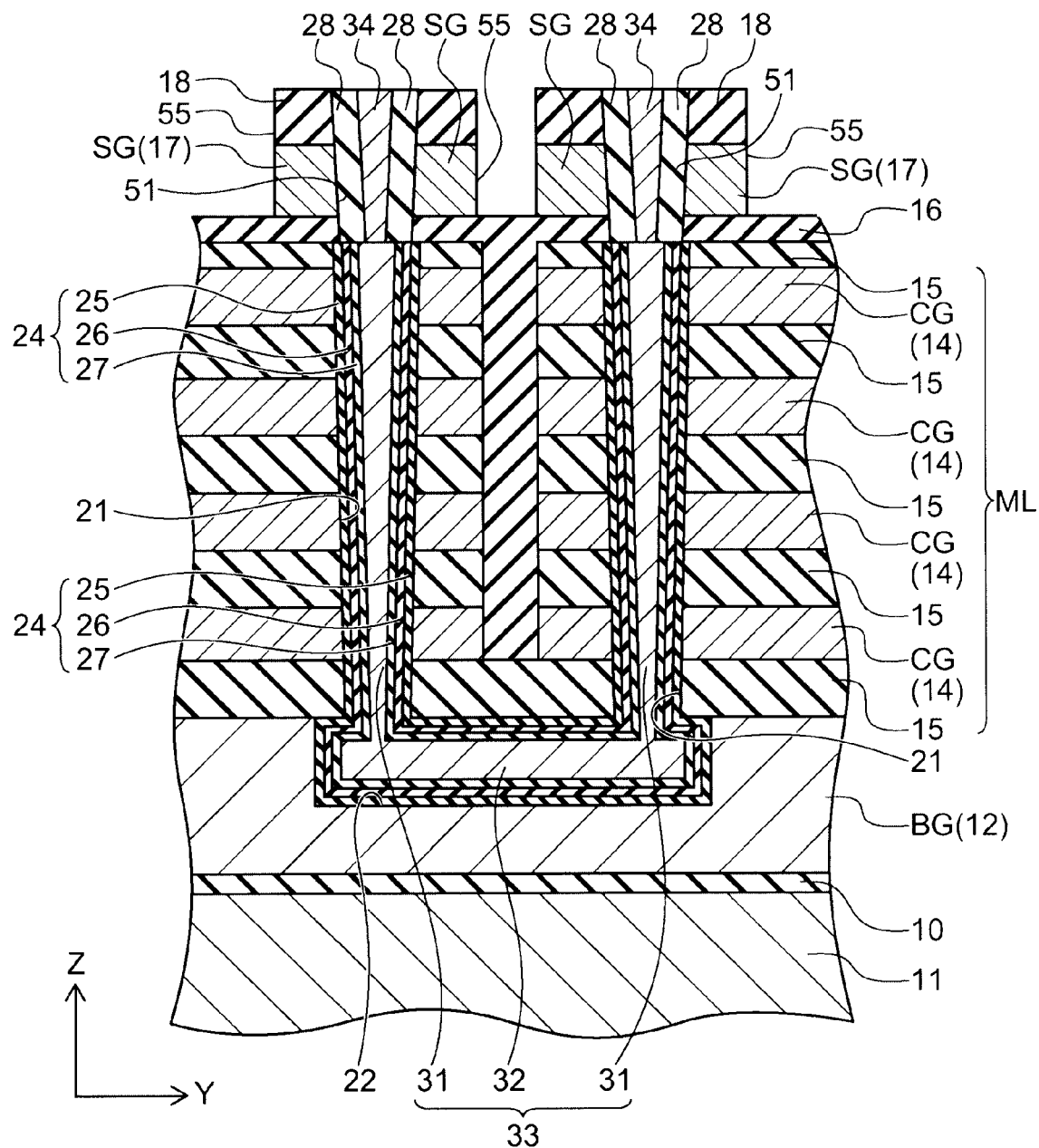
FIG. 18 is a cross-sectional view of processes of the method for manufacturing the memory chip of the nonvolatile semiconductor memory device according to the third embodiment.

Then, as illustrated in FIG. 18, an insulating film is deposited on the entire surface, and amorphous silicon is deposited. Etch-back is performed on the amorphous silicon and the insulating film to leave the amorphous silicon and the insulating film only in the through-holes 51. Thereby, the gate insulating film 28 is formed on the inner face of the through-holes 51 and the amorphous silicon is filled. Then, heat treatment is performed at a temperature of, for example, 600° C. to crystallize the amorphous silicon in the through-holes 51 to form polysilicon. Ion implantation is performed on the polysilicon using arsenic (As) with, for example, an acceleration voltage of 40 keV and a dose of $3\times10^{15}$ cm$^{-2}$ to form a drain diffusion layer (not illustrated). Thereby, the silicon pillars 34 are formed in the through-holes 51. The silicon pillars 34 connect to the silicon pillars 31.

Continuing, patterning by RIE and the like is performed on the insulating film 18 and the conductive film 17 to make trenches 55 aligned in the X direction in the regions between the silicon pillars 34 adjacent to each other in the Y direction. Thereby, the conductive film 17 is divided along the Y direction to form multiple selection gate electrodes SG to align in the X direction.

Then, as illustrated in FIG. 3, the insulating film 19 is formed on the insulating film 18; source plugs SP are buried in the insulating film 19; and the source lines SL are formed on the insulating film 19 to align in the X direction. At this time, the source lines SL are connected to the drain diffusion layers of some of the silicon pillars 34 via the source plugs SP. Contacts (not illustrated) are formed in the inter-layer insulating film (not illustrated) provided around the stacked body ML to connect to each of the control gate electrodes CG and each of the selection gate electrodes SG from above. Then, the insulating film 20 is formed on the insulating film 19 to cover the source lines SL. Then, the bit plugs BP are buried in the insulating films 20 and 19 and the bit lines BL are formed on the insulating film 20 to align in the Y direction. At this time, the bit lines BL are connected to the drain diffusion layers of the remaining silicon pillars 34 via the bit plugs BP. On the other hand, the peripheral circuit unit CCS (referring to FIG. 1) is formed by normal methods. Thereby, the nonvolatile semiconductor memory device 1 is manufactured.

According to this embodiment, the nonvolatile semiconductor memory device 1 according to the first embodiment described above can be manufactured. According to this embodiment, it is unnecessary to make the diameters of the through-holes 21 excessively uniform because the memory cells in which operation errors occur can be excluded from undergoing the operations after the device 1 is manufactured. Therefore, the aspect ratio of the through-hole 21 can be increased; the number of stacks of the electrode films 14 can be increased; and the number of memory cells per unit surface area can be increased. As a result, the cost per bit and the manufacturing cost of the nonvolatile semiconductor memory device 1 can be reduced.

The series of processes described above forming the stacked body ML, making the through-hole 21 in the stacked body ML, and filling the silicon pillar 31 into the through-hole 21 may be performed twice to manufacture the nonvolatile semiconductor memory device 2 according to the second embodiment described above. By performing the processes described above three times or more, a nonvolatile semiconductor memory device can be manufactured in which partial stacked bodies are stacked in three levels or more. In such a case as well, the number of times that the through-holes 21 are made can be reduced when manufacturing the device 1 in which the prescribed number of levels of the electrode film 14 is stacked; and accordingly, the number of lithography processes can be reduced. As a result, the manufacturing cost of the nonvolatile semiconductor memory device can be reduced.

Hereinabove, the invention is described with reference to exemplary embodiments. However, the invention is not limited to these exemplary embodiments. Additions, deletions, or design modifications of components or additions, omissions, or condition modifications of processes appropriately made by one skilled in the art in regard to the exemplary embodiments described above are within the scope of the invention to the extent that the purport of the invention is included.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modification as would fall within the scope and spirit of the inventions.

The invention claimed is:

1. A nonvolatile semiconductor memory device, comprising
    a memory cell array and
    a control circuit,
    the memory cell array including
        a stacked body including a plurality of insulating films alternately stacked with a plurality of electrode films,
        a through-hole being made in the stacked body to align in a stacking direction,
        a semiconductor pillar buried in the through-hole, and
        a charge storage film provided between the electrode films and the semiconductor pillar,
    memory cells being formed at each intersection between the electrode films and the semiconductor pillar,
    the control circuit writing a first value to at least some of the memory cells, performing an erasing operation of the first value from the memory cell written with the first value, reading data stored in the memory cell having undergone the erasing operation, and setting the memory cell to be unusable in a case that the first value is read from the memory cell.

2. The device according to claim 1, wherein the writing of the first value is performed by injecting an electron into the charge storage film, and the erasing of the first value is performed by injecting an electron hole into the charge storage film.

3. The device according to claim 1, wherein the control circuit performs the reading of the data simultaneously for a plurality of memory cells and sets the entire plurality of memory cells to be unusable in a case that the first value is read from at least one of the plurality of memory cells.

4. The device according to claim 3, wherein
    each of the electrode films is divided into a plurality of control gate electrodes aligned in the same direction, and
    the plurality of memory cells is memory cells formed with a common control gate electrode.

5. The device according to claim 1, further comprising
    a substrate, the stacked body being formed on the substrate,
    a diameter of the through-hole being smaller toward the substrate,
    the control circuit performing the writing of the first value, the erasing of the first value, and the reading of the data on the memory cell of an uppermost level.

6. The device according to claim 5, wherein the through-holes are made collectively by etching.

7. The device according to claim 1, further comprising
    a substrate, the stacked body being formed on the substrate,
    the stacked body including a plurality of partial stacked bodies arranged in the stacking direction, a plurality of the electrode films being stacked in each of the partial stacked bodies,
    in each of the partial stacked bodies, a diameter of the through-hole being smaller toward the substrate,
    the control circuit performing the writing of the first value, the erasing of the first value, and the reading of the data on the memory cell of an uppermost level of each of the partial stacked bodies.

8. The device according to claim 7, wherein portions of the through-holes made in each of the partial stacked bodies are made collectively by etching.

9. The device according to claim 1, wherein the control circuit performs the writing of the first value, the erasing of the first value, and the reading of the data during a formatting.

10. The device according to claim 1, further comprising:
a substrate, the stacked body being formed on the substrate;
a back gate disposed between the substrate and the stacked body; and
a connection member provided in the back gate to connect two mutually adjacent semiconductor pillars to each other.

11. The device according to claim 1, further comprising:
a first substrate, the memory cell array being formed in the first substrate; and
a second substrate, the control circuit being formed in the second substrate.

12. A method for driving a nonvolatile semiconductor memory device, the device including: a stacked body including a plurality of insulating films alternately stacked with a plurality of electrode films, a through-hole being made in the stacked body to align in a stacking direction; a semiconductor pillar buried in the through-hole; and a charge storage film provided between the electrode films and the semiconductor pillar, memory cells being formed at each intersection between the electrode films and the semiconductor pillar, the method comprising:
writing a first value to at least some of the memory cells, performing an erasing operation of the first value from the memory cell written with the first value, reading data stored in the memory cell having undergone the erasing operation, and setting the memory cell to be unusable in a case that the first value is read from the memory cell.

13. The method according to claim 12, wherein the writing of the first value is performed by injecting an electron into the charge storage film, and the erasing of the first value is performed by injecting an electron hole into the charge storage film.

14. The method according to claim 12, wherein the control circuit performs the reading of the data simultaneously for a plurality of memory cells and sets the entire plurality of memory cells to be unusable in a case that the first value is read from at least one of the plurality of memory cells.

15. The method according to claim 14, wherein
each of the electrode films is divided into a plurality of control gate electrodes aligned in the same direction, and
the plurality of memory cells is memory cells formed with a common control gate electrode.

16. The method according to claim 12, wherein
the nonvolatile semiconductor memory device further includes a substrate, the stacked body being formed on the substrate, a diameter of the through-hole being smaller toward the substrate, and
the writing of the first value, the erasing of the first value, and the reading of the data are performed on the memory cell of an uppermost level.

17. The method according to claim 12, wherein
the nonvolatile semiconductor memory device further includes a substrate, the stacked body being formed on the substrate, a plurality of partial stacked bodies being provided in the stacked body and arranged in the stacking direction, a plurality of the electrode films being stacked in each of the partial stacked bodies, a diameter of the through-hole in each of the partial stacked bodies being smaller toward the substrate, and
the writing of the first value, the erasing of the first value, and the reading of the data are performed on a memory cell of an uppermost level of each of the partial stacked bodies.

18. The method according to claim 12, wherein the control circuit performs the writing of the first value, the erasing of the first value, and the reading of the data during a formatting.

* * * * *